(12) United States Patent
Shiomi

(10) Patent No.: US 9,954,054 B2
(45) Date of Patent: Apr. 24, 2018

(54) SILICON CARBIDE SEMICONDUCTOR DEVICE AND METHOD FOR MANUFACTURING THE SAME

(71) Applicant: Sumitomo Electric Industries, Ltd., Osaka-shi (JP)

(72) Inventor: Hiromu Shiomi, Tsukuba (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/322,860

(22) PCT Filed: Jun. 30, 2015

(86) PCT No.: PCT/JP2015/068803
§ 371 (c)(1),
(2) Date: Dec. 29, 2016

(87) PCT Pub. No.: WO2016/002766
PCT Pub. Date: Jan. 7, 2016

(65) Prior Publication Data
US 2017/0141186 A1   May 18, 2017

(30) Foreign Application Priority Data
Jun. 30, 2014   (JP) ................................. 2014-134898

(51) Int. Cl.
*H01L 29/06* (2006.01)
*H01L 29/10* (2006.01)
(Continued)

(52) U.S. Cl.
CPC .......... *H01L 29/063* (2013.01); *H01L 21/046* (2013.01); *H01L 29/1095* (2013.01); *H01L 29/66068* (2013.01); *H01L 29/7813* (2013.01)

(58) Field of Classification Search
CPC ................. H01L 29/063; H01L 21/046; H01L 29/66068; H01L 29/1095; H01L 29/7813
See application file for complete search history.

(56) References Cited

U.S. PATENT DOCUMENTS 6,342,709 B1 * 1/2002 Sugawara ........... H01L 29/0619
257/138
2010/0224932 A1 * 9/2010 Takaya ................ H01L 29/0623
257/330

(Continued)

FOREIGN PATENT DOCUMENTS

JP   H10-098188 A   4/1998
JP   2007-242852 A   9/2007

(Continued)

OTHER PUBLICATIONS

Nakano et al., "690V, 1.00 mΩcm² 4H-SiC Double-Trench MOSFETs," Materials Science Forum vols. 717-720 (2012), pp. 1069-1072.

(Continued)

*Primary Examiner* — Roy Potter
*Assistant Examiner* — Paul Patton
(74) *Attorney, Agent, or Firm* — Venable LLP; Michael A. Sartori; Laura G. Remus

(57) ABSTRACT

A fourth impurity region includes a first region facing a bottom portion of a trench and a part of a second impurity region and a second region facing the second impurity region. A first impurity region includes a third region in contact with a side surface of the trench, the second impurity region, the first region, and a second region and a fourth region which is located on a side of a second main surface relative to the third region, electrically connected to the third region, and lower in impurity concentration than the third region. A surface of the first region facing the second main surface is located on the side of the second main surface in (Continued)

a direction perpendicular to the second main surface relative to a surface of the second region facing the second main surface.

25 Claims, 12 Drawing Sheets

(51) Int. Cl.
  *H01L 29/78* (2006.01)
  *H01L 29/66* (2006.01)
  *H01L 21/04* (2006.01)

(56) References Cited

U.S. PATENT DOCUMENTS

2014/0175459 A1* 6/2014 Yamamoto .......... H01L 29/1095
 257/77
2015/0048382 A1 2/2015 Takeuchi et al.

FOREIGN PATENT DOCUMENTS

| | | |
|---|---|---|
| JP | 2008-147232 A | 6/2008 |
| JP | 2012-169384 A | 9/2012 |
| WO | 2013/157259 A1 | 10/2013 |

OTHER PUBLICATIONS

International Search Report in counterpart International Application No. PCT/JP2015/068803, dated Sep. 8, 2015.

* cited by examiner

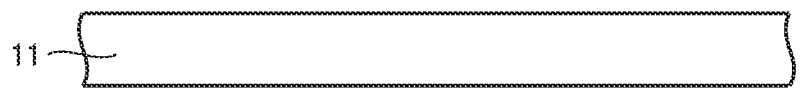
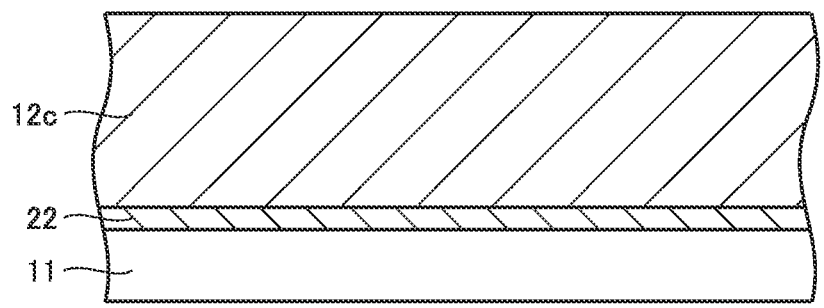
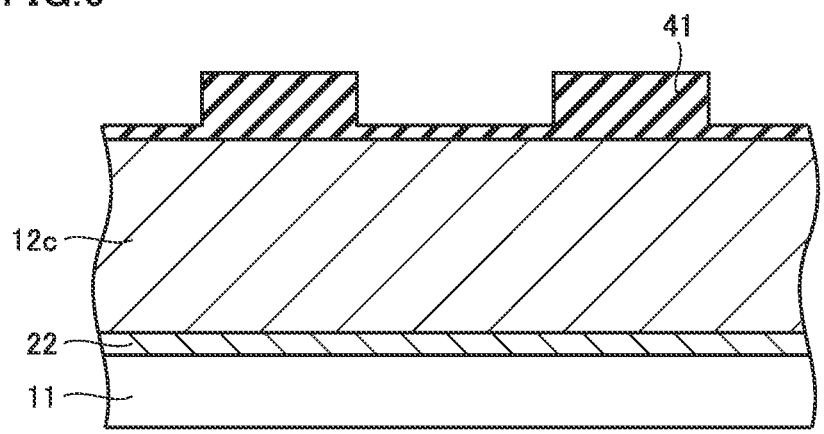

SILICON CARBIDE SEMICONDUCTOR DEVICE AND METHOD FOR MANUFACTURING THE SAME

TECHNICAL FIELD

The present invention relates to a silicon carbide semiconductor device and a method for manufacturing the same, and particularly to a silicon carbide semiconductor device having a trench provided in a main surface and a method for manufacturing the same.

BACKGROUND ART

In order to allow a semiconductor device to be high in breakdown voltage and low in loss and to be used in a high-temperature environment, silicon carbide has recently increasingly been adopted as a material forming a semiconductor device. Silicon carbide is a wide band gap semiconductor greater in band gap than silicon which has conventionally widely been used as a material forming a semiconductor device. Therefore, by adopting silicon carbide as a material forming a semiconductor device, a higher breakdown voltage and a lower on-resistance of a semiconductor device can be achieved. A semiconductor device in which silicon carbide has been adopted as a material is also advantageous in that lowering in characteristics during use in a high-temperature environment is less than in a semiconductor device in which silicon has been adopted as a material.

For example, Japanese Patent Laying-Open No. 2008-147232 (PTD 1) describes a trench metal oxide semiconductor field effect transistor (MOSFET) composed of silicon carbide. According to the MOSFET, a thickness of a channel layer is set to at least a thickness calculated in a prescribed calculation formula so as not to cause punch through due to a short channel effect, and a lower end of a base layer is provided on a side of a drain electrode relative to a lower end of a gate trench.

Y. Nakano et al., "690V, 1.00 mΩcm² 4H—SiC Double-Trench MOSFETs," Materials Science Forum Vols. 717-720 (2012) page 1069-1072 (NPD 1) describes a MOSFET in which a trench for holding a breakdown voltage is fabricated adjacently to a trench for switching and a bottom portion of the trench for holding a breakdown voltage is provided on a side of a drain electrode relative to a bottom portion of the trench for switching. A p-type base layer is provided under the trench for holding a breakdown voltage.

According to a trench MOSFET described in International Publication WO2013/157259 (PTD 2), a p-type region is provided as being in contact with a bottom portion of a gate trench.

CITATION LIST

Patent Document

PTD 1: Japanese Patent Laying-Open No. 2008-147232
PTD 2: International Publication WO2013/157259

Non Patent Document

NPD 1: Y. Nakano et al., "690V, 1.00 mΩcm² 4H—SiC Double-Trench MOSFETs," Materials Science Forum Vols. 717-720 (2012) page 1069-1072

SUMMARY OF INVENTION

Technical Problem

Mobility at an interface between a semiconductor layer of a silicon carbide semiconductor and an insulator significantly lowers with a higher concentration of an impurity in the semiconductor layer. In the case of a trench transistor, however, a semiconductor layer which forms the channel is exposed to high electric field because it is located not at a surface of a substrate but in the inside of the substrate. Therefore, a concentration of an impurity in the semiconductor layer cannot sufficiently be low.

In the MOSFET described in Japanese Patent Laying-Open No. 2008-147232, a semiconductor portion which forms the channel is provided above a p-type base layer, so that application of high electric field to the semiconductor portion which forms the channel by a depletion layer which extends under the p-type base layer is prevented. In the MOSFET described in Y. Nakano et al., "690V, 1.00 mΩcm² 4H—SiC Double-Trench MOSFETs," Materials Science Forum Vols. 717-720 (2012) page 1069-1072, in order to fabricate the structure above, a trench for forming the channel is protected by fabricating a trench for holding a breakdown voltage adjacently to a trench for forming the channel, providing a p-type base layer under the trench for holding a breakdown voltage, and forming a depletion layer at a position deeper than a bottom portion of the trench for forming the channel.

In each structure above, however, a gate oxide film formed as being in contact with the trench and the semiconductor layer forming the channel are protected by the same breakdown voltage holding structure. Therefore, when avalanche occurs, high electric field may be applied also to the gate oxide film similarly to the semiconductor layer and the gate oxide film may be broken. It has thus been unable to obtain high reliability.

In the MOSFET described in International Publication WO2013/157259, electric field at a bottom portion of a trench is relaxed by forming a p-type region at the bottom portion of the trench. Since electric field is concentrated to a side portion of the trench, it has been difficult to sufficiently protect the semiconductor layer which forms the channel and it has been unable to obtain high reliability.

An object of one manner of the present invention is to provide a highly reliable silicon carbide semiconductor device and a method for manufacturing the same.

Solution to Problem

A silicon carbide semiconductor device according to one manner of the present invention includes a silicon carbide substrate, a gate insulating film, a gate electrode, a first electrode, and a second electrode. The silicon carbide substrate has a first main surface and a second main surface opposite to the first main surface. The silicon carbide substrate includes a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region. The first main surface of the silicon carbide substrate has a trench provided, the trench having a side surface continuous to the first main surface and a bottom portion continuous to the side surface. The fourth impurity region includes a first region facing the bottom portion of the trench and a part of the second impurity region and a second region facing the second impurity region. The first impurity region includes a third region in contact with the side surface of the trench, the second impurity region, the first region, and the second region and a fourth region which is located on a side of the second main surface relative to the third region, electrically connected to the third region, and lower in impurity concentration than the third region. A surface of the first region facing the second main surface is located on the side of the second main surface in a direction perpendicular to the second main surface relative to a surface of the second region facing the second main surface. The gate insulating film is in contact with the third region, the second impurity region, and the third impurity region at the side surface of the trench. The gate electrode is provided on the gate insulating film. The first electrode is electrically connected to the third impurity region on a side of the first main surface and the second electrode is electrically connected to the fourth region on the side of the second main surface. The fourth impurity region is electrically connected to the first electrode.

A method for manufacturing a silicon carbide semiconductor device according to one manner of the present invention includes steps below. A silicon carbide substrate having a first main surface and a second main surface opposite to the first main surface is prepared. The silicon carbide substrate includes a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region. The first main surface of the silicon carbide substrate has a trench provided, the trench having a side surface continuous to the first main surface and a bottom portion continuous to the side surface. The fourth impurity region includes a first region facing the bottom portion of the trench and a part of the second impurity region and a second region facing the second impurity region. The first impurity region includes a third region in contact with the side surface of the trench, the second impurity region, the first region, and the second region and a fourth region which is located on a side of the second main surface relative to the third region, electrically connected to the third region, and lower in impurity concentration than the third region. A surface of the first region facing the second main surface is located on the side of the second main surface in a direction perpendicular to the second main surface relative to a surface of the second region facing the second main surface. A gate insulating film in contact with the third region, the second impurity region, and the third impurity region at the side surface of the trench is formed. A gate electrode is formed on the gate insulating film. A first electrode electrically connected to the third impurity region on a side of the first main surface is formed. A second electrode electrically connected to the fourth region on the side of the second main surface is formed. The fourth impurity region is electrically connected to the first electrode.

Advantageous Effects of Invention

According to one manner of the present invention, a highly reliable silicon carbide semiconductor device and a method for manufacturing the same can be provided.

BRIEF DESCRIPTION OF DRAWINGS

FIG. 4 is a schematic cross-sectional view for schematically illustrating a first step in the method for manufacturing the silicon carbide semiconductor device according to the first embodiment of the present invention.

FIG. 5 is a schematic cross-sectional view for schematically illustrating a second step in the method for manufacturing the silicon carbide semiconductor device according to the first embodiment of the present invention.

FIG. 6 is a schematic cross-sectional view for schematically illustrating a third step in the method for manufacturing the silicon carbide semiconductor device according to the first embodiment of the present invention.

DESCRIPTION OF EMBODIMENTS

Figure 1:
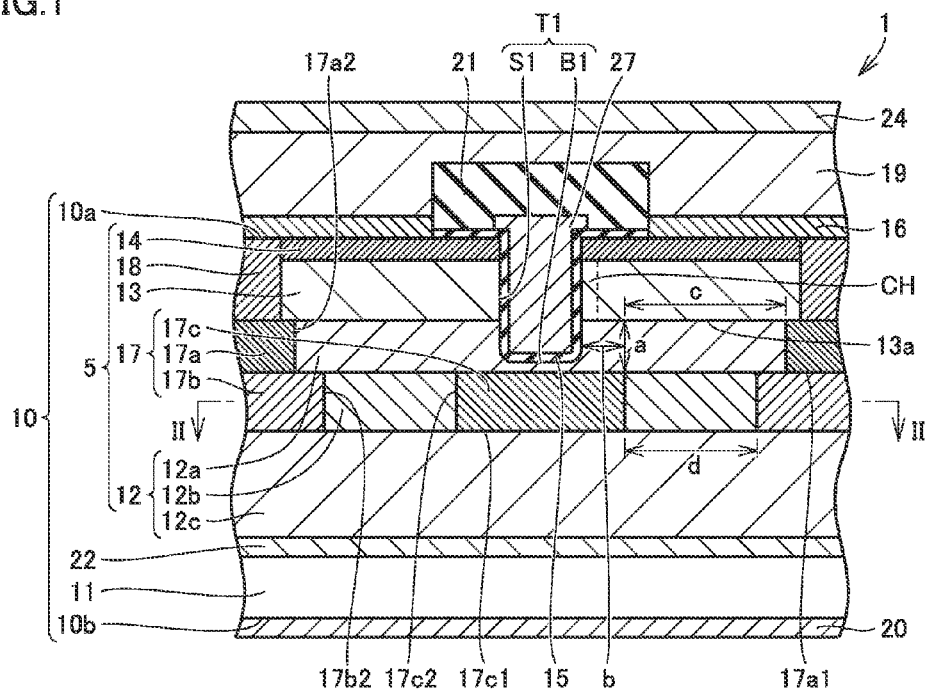
FIG. 1 is a vertical schematic cross-sectional view for schematically illustrating a structure of a silicon carbide semiconductor device according to a first embodiment of the present invention.

Description of Embodiments of the Present Invention

Embodiments of the present invention will initially be listed and described.

(1) A silicon carbide semiconductor device 1 according to one manner of the present invention includes a silicon carbide substrate 10, a gate insulating film 15, a gate electrode 27, a first electrode 16, and a second electrode 20. Silicon carbide substrate 10 has a first main surface 10a and a second main surface 10b opposite to first main surface 10a. Silicon carbide substrate 10 includes a first impurity region 12 having a first conductivity type, a second impurity region 13 which is in contact with first impurity region 12 and has a second conductivity type different from the first conductivity type, a third impurity region 14 which has the first conductivity type and is spaced apart from first impurity region 12 by second impurity region 13, and a fourth impurity region 17 which has the second conductivity type and is higher in impurity concentration than second impurity region 13. First main surface 10a of silicon carbide substrate 10 has a trench T1 provided, trench T1 having a side surface S1 continuous to first main surface 10a and a bottom portion B1 continuous to side surface S1. Fourth impurity region 17 includes a first region 17c facing bottom portion B1 of trench T1 and a part of second impurity region 13 and a second region 17a facing second impurity region 13. First impurity region 12 includes a third region 12a in contact with side surface S1 of trench T1, second impurity region 13, first region 17c, and second region 17a and a fourth region 12c which is located on a side of second main surface 10b relative to third region 12a, electrically connected to third region 12a, and lower in impurity concentration than third region 12a. A surface 17c1 of first region 17c facing second main surface 10b is located on the side of second main surface 10b in a direction perpendicular to second main surface 10b relative to a surface 17a1 of the second region facing second main surface 10b. Gate insulating film 15 is in contact with third region 12a, second impurity region 13, and third impurity region 14 at side surface S1 of trench T1. Gate electrode 27 is provided on gate insulating film 15. First electrode 16 is electrically connected to third impurity region 14 on a side of first main surface 10a and second electrode 20 is electrically connected to fourth region 12c on the side of second main surface 10b. Fourth impurity region 17 is electrically connected to first electrode 16.

According to the silicon carbide semiconductor device according to (1) above, fourth impurity region 17 includes first region 17c facing bottom portion B1 of trench T1 and a part of second impurity region 13 and second region 17a facing second impurity region 13. Surface 17c1 of first region 17c which faces second main surface 10b is located on the side of second main surface 10b in the direction perpendicular to second main surface 10b relative to surface 17a1 of the second region which faces second main surface 10b. Exposure of second impurity region 13 to high electric field can thus be suppressed. Since third region 12a is higher in impurity concentration than fourth region 12c, an on-resistance can be lowered. By providing first region 17c facing bottom portion B1 of trench T1 and a part of second impurity region 13, application of high electric field to gate insulating film 15 in contact with side surface S1 and bottom portion B1 of trench T1 and degradation or breakdown of gate insulating film 15 can be suppressed. In particular, a portion of second impurity region 13 where avalanche occurs is spaced apart from gate insulating film 15, so that degradation or breakdown of gate insulating film 15 at the time when avalanche occurs can effectively be suppressed. Consequently, a highly reliable silicon carbide semiconductor device can be obtained.

(2) In the silicon carbide semiconductor device according to (1) above, preferably, fourth impurity region 17 further includes a fifth region 17b which is located opposite to second impurity region 13 when viewed from second region 17a and is in contact with second region 17a. Exposure of second impurity region 13 to high electric field can thus effectively be suppressed.

(3) In the silicon carbide semiconductor device according to (2) above, preferably, a side surface 17a2 of second region 17a is provided to protrude toward side surface S1 of trench T1 relative to a side surface 17b2 of fifth region 17b. Thus, electric field is once narrowed by first region 17c and fifth region 17b and then electric field is further narrowed by second region 17a, so that high electric field can be prevented from being directly applied to second impurity region 13.

(4) In the silicon carbide semiconductor device according to (2) above, preferably, side surface 17a2 of second region 17a is provided to retract toward a side opposite to side surface S1 of trench T1 relative to side surface 17b2 of fifth region 17b. Thus, electric field is once narrowed by first region 17c and fifth region 17b and then electric field is spread by second region 17a in a direction in parallel to first main surface 10a so that intensity of electric field applied to second impurity region 13 can be reduced.

(5) In the silicon carbide semiconductor device according to any of (1) to (4) above, preferably, a distance a between second impurity region 13 and first region 17c in a direction perpendicular to second main surface 10b is not smaller than 0.2 μm and not greater than 2 μm. Thus, a silicon carbide semiconductor device which is low in characteristic on-resistance while it maintains a high breakdown voltage can be obtained.

(6) In the silicon carbide semiconductor device according to any of (1) to (5) above, preferably, a distance b between a point of contact between side surface S1 and bottom portion B1 of trench T1 and a side surface 17c2 of first region 17c in a direction in parallel to second main surface 10b is not smaller than 0.1 μm and not greater than 0.5 μm. Thus, a silicon carbide semiconductor device which is low in characteristic on-resistance while it maintains low intensity of electric field applied to gate insulating film 15 can be obtained.

(7) In the silicon carbide semiconductor device according to any of (1) to (6) above, preferably, a distance c between side surface 17c2 of first region 17c and side surface 17a2 of second region 17a in a direction in parallel to second main surface 10b is not smaller than 0.6 μm and not greater than 1.5 μm. Thus, a silicon carbide semiconductor device which is low in characteristic on-resistance while it maintains a high breakdown voltage can be obtained.

(8) In the silicon carbide semiconductor device according to any of (1) to (7) above, preferably, a concentration of an impurity in third region 12a is not lower than $1\times10^{16}$ cm$^{-3}$ and not higher than $4\times10^{17}$ cm$^{-3}$. Thus, a silicon carbide semiconductor device low in characteristic on-resistance can be obtained.

(9) In the silicon carbide semiconductor device according to any of (1) to (8) above, preferably, a concentration of an impurity in second impurity region 13 is not lower than $1\times10^{15}$ cm$^{-3}$ and not higher than $4\times10^{17}$ cm$^{-3}$. Thus, a silicon carbide semiconductor device low in characteristic on-resistance can be obtained.

(10) A method for manufacturing silicon carbide semiconductor device 1 according to one manner of the present invention includes steps below. Silicon carbide substrate 10 having first main surface 10a and second main surface 10b opposite to first main surface 10a is prepared. Silicon carbide substrate 10 includes first impurity region 12 having a first conductivity type, second impurity region 13 which is in contact with first impurity region 12 and has a second conductivity type different from the first conductivity type, third impurity region 14 which has the first conductivity type and is spaced apart from first impurity region 12 by second impurity region 13, and fourth impurity region 17 which has the second conductivity type and is higher in impurity concentration than second impurity region 13. First main surface 10a of silicon carbide substrate 10 has trench T1 provided, trench T1 having side surface S1 continuous to first main surface 10a and bottom portion B1 continuous to side surface S1. Fourth impurity region 17 includes first region 17c facing bottom portion B1 of trench T1 and a part of second impurity region 13 and second region 17a facing second impurity region 13. First impurity region 12 includes third region 12a in contact with side surface S1 of trench T1, second impurity region 13, first region 17c, and second region 17a and fourth region 12c which is located on a side of second main surface 10b relative to third region 12a, electrically connected to third region 12a, and lower in impurity concentration than third region 12a. Surface 17c1 of first region 17c facing second main surface 10b is located on the side of second main surface 10b in a direction perpendicular to second main surface 10b relative to surface 17a1 of second region 17a facing second main surface 10b. Gate insulating film 15 in contact with third region 12a, second impurity region 13, and third impurity region 14 at side surface S1 of trench T1 is formed. Gate electrode 27 is formed on gate insulating film 15. First electrode 16 electrically connected to third impurity region 14 is formed on a side of first main surface 10a. Second electrode 20 electrically connected to fourth region 12c on the side of second main surface 10b is formed. Fourth impurity region 17 is electrically connected to first electrode 16.

According to the method for manufacturing a silicon carbide semiconductor device according to (10) above, fourth impurity region 17 includes first region 17c facing bottom portion B1 of trench T1 and a part of second impurity region 13 and second region 17a facing second impurity region 13. Surface 17c1 of first region 17c which faces second main surface 10b is located on the side of second main surface 10b in the direction perpendicular to second main surface 10b relative to surface 17a1 of the second region which faces second main surface 10b. Exposure of second impurity region 13 to high electric field can thus be suppressed. By providing first region 17c facing bottom portion B1 of trench T1 and a part of second impurity region 13, application of high electric field to gate insulating film 15 in contact with side surface S1 and bottom portion B1 of trench T1 and degradation or breakdown of gate insulating film 15 can be suppressed. In particular, a portion of a base region 13 where avalanche occurs is spaced apart from gate insulating film 15, so that degradation or breakdown of gate insulating film 15 at the time when avalanche occurs can effectively be suppressed. Consequently, a highly reliable silicon carbide semiconductor device can be obtained.

(11) In the method for manufacturing silicon carbide semiconductor device 1 according to (10) above, preferably, forming silicon carbide substrate 10 includes forming fourth region 12c through epitaxial growth, forming first region 17c by implanting ions into fourth region 12c, forming third region 12a on first region 17c through epitaxial growth, and forming second region 17a by implanting ions into third region 12a. Thus, first region 17c and second region 17a high in impurity concentration can effectively be formed.

(12) In the method for manufacturing silicon carbide semiconductor device 1 according to (11) above, preferably, forming silicon carbide substrate 10 further includes forming a sixth region 12b which has the first conductivity type and is higher in impurity concentration than fourth region 12c by implanting ions into fourth region 12c. In forming third region 12a, third region 12a is formed on each of first region 17c and sixth region 12b. Thus, a characteristic on-resistance can be lowered.

(13) In the method for manufacturing silicon carbide semiconductor device 1 according to (10) above, preferably, forming silicon carbide substrate 10 includes forming fourth region 12c through epitaxial growth, forming third region 12a on fourth region 12c through epitaxial growth, forming first region 17c in contact with fourth region 12c by implanting ions into fourth region 12c with first implantation energy, and forming second region 17a in contact with third region 12a by implanting ions into third region 12a with second implantation energy lower than the first implantation energy. Thus, first region 17c and second region 17a can be formed with a simplified method.

(14) In the method for manufacturing silicon carbide semiconductor device 1 according to any of (10) to (13) above, preferably, forming silicon carbide substrate 10 further includes forming second impurity region 13 in contact with both of second region 17a and third region 12a through epitaxial growth. Thus, second impurity region 13 uniform in impurity concentration can be formed.

(15) In the method for manufacturing silicon carbide semiconductor device 1 according to any of (10) to (14) above, preferably, fourth impurity region 17 further includes fifth region 17b which is located opposite to second impurity region 13 when viewed from second region 17a and is in contact with second region 17a. Thus, exposure of second impurity region 13 to high electric field can effectively be suppressed.

(16) In the method for manufacturing silicon carbide semiconductor device 1 according to (15) above, preferably, side surface 17a2 of second region 17a is provided to protrude toward side surface S1 of trench T1 relative to side surface 17b2 of fifth region 17b. Thus, electric field is once narrowed by first region 17c and fifth region 17b and then electric field is further narrowed by second region 17a, so that high electric field can be prevented from being directly applied to second impurity region 13.

(17) In the method for manufacturing silicon carbide semiconductor device 1 according to (15) above, preferably, side surface 17a2 of second region 17a is provided to retract toward a side opposite to side surface S1 of trench T1 relative to side surface 17b2 of fifth region 17b. Thus, electric field is once narrowed by first region 17c and fifth region 17b and then electric field is spread by second region 17a in a direction in parallel to first main surface 10a so that intensity of electric field applied to second impurity region 13 can be reduced.

(18) In the method for manufacturing silicon carbide semiconductor device 1 according to any of (10) to (17) above, preferably, distance a between second impurity region 13 and first region 17c in a direction perpendicular to second main surface 10b is not smaller than 0.2 μm and not greater than 2 μm. Thus, a silicon carbide semiconductor device which is low in characteristic on-resistance while it maintains a high breakdown voltage can be obtained.

(19) In the method for manufacturing silicon carbide semiconductor device 1 according to any of (10) to (18) above, preferably, a distance between a point of contact between side surface S1 and bottom portion B1 of trench T1 and side surface 17c2 of first region 17c in a direction in parallel to second main surface 10b is not smaller than 0.1 μm and not greater than 0.5 μm. Thus, a silicon carbide semiconductor device which is low in characteristic on-resistance while it maintains low intensity of electric field applied to gate insulating film 15 can be obtained.

(20) In the method for manufacturing silicon carbide semiconductor device 1 according to any of (10) to (19) above, preferably, a distance between side surface 17c2 of first region 17c and side surface 17a2 of second region 17a in a direction in parallel to second main surface 10b is not smaller than 0.6 μm and not greater than 1.5 μm. Thus, a silicon carbide semiconductor device which is low in characteristic on-resistance while it maintains a high breakdown voltage can be obtained.

(21) In the method for manufacturing silicon carbide semiconductor device 1 according to (10) above, preferably, third region 12a is formed by implantation of ions. Thus, it is not necessary to interpose an epitaxial step during fabrication of a device, a process can be simplified, and a construction time can be decreased.

(22) In the method for manufacturing silicon carbide semiconductor device 1 according to any of (10) to (13) above, preferably, second impurity region 13 is formed by implantation of ions. Thus, it is not necessary to interpose an epitaxial step during fabrication of a device, a process can be simplified, and a construction time can be decreased.

Details of Embodiments of the Present Invention

An embodiment of the present invention will be described hereinafter with reference to the drawings. In the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ), and { }, respectively. Moreover, a crystallographically negative index is expressed by a number with a bar "-" thereabove, however, a negative sign herein precedes a number.

First Embodiment

A construction of a MOSFET representing a silicon carbide semiconductor device according to a first embodiment of the present invention will initially be described.

Referring to FIG. 1, a MOSFET 1 according to the first embodiment mainly has silicon carbide substrate 10, gate electrode 27, gate insulating film 15, an interlayer insulating film 21, a source electrode 16, a source interconnection 19, a drain electrode 20, and a protecting film 24. Silicon carbide substrate 10 has first main surface 10a and second main surface 10b opposite to first main surface 10a, and mainly includes a silicon carbide single-crystal substrate 11 and a silicon carbide epitaxial layer 5 provided on silicon carbide single-crystal substrate 11. Silicon carbide single-crystal substrate 11 forms second main surface 10b of silicon carbide substrate 10 and silicon carbide epitaxial layer 5 forms first main surface 10a of silicon carbide substrate 10.

Silicon carbide single-crystal substrate 11 is composed of single crystals of hexagonal silicon carbide having, for example, a polytype of 4H. First main surface 10a of silicon carbide substrate 10 has a maximal diameter, for example, of 150 mm and more preferably not smaller than 150 mm. First main surface 10a of silicon carbide substrate 10 is, for example, a {0001} plane or a surface angled off by not greater than 8° from the {0001} plane. Silicon carbide single-crystal substrate 11 has a thickness, for example, of 400 μm Silicon carbide single-crystal substrate 11 has a resistivity, for example, of 0.017 Ωcm.

Silicon carbide epitaxial layer 5 mainly has a drift region 12 (first impurity region 12), base region 13 (second impurity region 13), a source region 14 (third impurity region 14), a contact region 18, an embedded region 17 (fourth impurity region 17), and a buffer layer 22. Drift region 12 is an n-type (a first conductivity type) region containing an n-type impurity (a donor) for providing the n-type such as nitrogen. Drift region 12 has fourth region 12c provided on buffer layer 22, sixth region 12b provided on fourth region 12c, and third region 12a provided on sixth region 12b. Third region 12a is in contact with base region 13. Sixth region 12b is in contact with third region 12a and located opposite to base region 13 when viewed from third region 12a. Fourth region 12c is in contact with sixth region 12b and located opposite to third region 12a when viewed from sixth region 12b. Buffer layer 22 is higher in impurity concentration, for example, than fourth region 12c, and provided between silicon carbide single-crystal substrate 11 and fourth region 12c.

Base region 13 (second impurity region 13) is provided on each of drift region 12 and embedded region 17 as being in contact with drift region 12. Base region 13 is a region of the p-type (a second conductivity type) different from the n-type. Base region 13 contains a p-type impurity (an acceptor) for providing the p-type such as aluminum (Al) or boron (B). Preferably, a concentration of a p-type impurity in base region 13 is not lower than $1\times10^{15}$ cm$^{-3}$ and not higher than $4\times10^{17}$ cm$^{-3}$, more preferably not lower than $3\times10^{15}$ cm$^{-3}$ and not higher than $3\times10^{16}$ cm$^{-3}$, and further preferably not lower than $5\times10^{15}$ cm$^{-3}$ and not higher than $1\times10^{16}$ cm$^{-3}$. A concentration of a p-type impurity in base region 13 is preferably not lower than $5\times10^{15}$ cm$^{-3}$. Base region 13 is an epitaxial layer formed, for example, through epitaxial growth. Base region 13 has a thickness, for example, not smaller than 0.5 µm and not greater than 1.5 µm.

Source region 14 (third impurity region 14) is provided on base region 13 as being spaced apart from drift region 12 by base region 13. Source region 14 contains an n-type impurity for providing the n-type such as phosphorus, and has the n-type. Source region 14 is higher in concentration of an n-type impurity than each of third region 12a, sixth region 12b, and fourth region 12c in drift region 12. A concentration of an n-type impurity such as phosphorus contained in source region 14 is, for example, not lower than $2\times10^{18}$ cm$^{-3}$ and not higher than $1\times10^{19}$ cm$^{-3}$. Source region 14 has a thickness, for example, not smaller than 0.1 µm and not greater than 0.4 µm.

Contact region 18 is a p-type region containing a p-type impurity such as aluminum or boron. Contact region 18 is provided as lying between source regions 14 and between base regions 13 so as to pass through each of source region 14 and base region 13 and to reach embedded region 17. In other words, contact region 18 is formed to connect first main surface 10a of silicon carbide substrate 10 and embedded region 17 to each other. Contact region 18 is higher in concentration of a p-type impurity than base region 13. A concentration of a p-type impurity such as aluminum contained in contact region 18 is, for example, not lower than $2\times10^{18}$ cm$^{-3}$ and not higher than $1\times10^{19}$ cm$^{-3}$. Contact region 18 has a thickness, for example, not smaller than 0.1 µm and not greater than 1.5 µm.

Trench T1 having side surface S1 continuous to first main surface 10a and bottom portion B1 continuous to side surface S1 is formed in first main surface 10a of silicon carbide substrate 10. Side surface S1 of trench T1 passes through each of source region 14 and base region 13 and reaches third region 12a in drift region 12, and bottom portion B1 of trench T1 is located in third region 12a in drift region 12. Third region 12a, base region 13, and source region 14 are in contact with side surface S1 of the trench and third region 12a is in contact with bottom portion B1 of trench T1. Side surface S1 of trench T1 extends along a direction substantially perpendicular to first main surface 10a of silicon carbide substrate 10, and bottom portion B1 of trench T1 is substantially in parallel to first main surface 10a of silicon carbide substrate 10. A boundary between side surface S1 and bottom portion B1 of trench T1 may be formed to have a curvature. Trench T1 has a depth, for example, not smaller than 0.5 µm and not greater than 2.3 µm. Trench T1 has a width, for example, not smaller than 0.5 µm and not greater than 3 µm.

Embedded region 17 contains a p-type impurity such as aluminum or boron and has the p-type. Embedded region 17 is higher in impurity concentration than base region 13. Embedded region 17 is electrically connected to source electrode 16. Embedded region 17 mainly includes first region 17c and second region 17a. Embedded region 17 may have fifth region 17b. A concentration of a p-type impurity such as aluminum contained in each of first region 17c, second region 17a, and fifth region 17b is, for example, not lower than $1\times10^{18}$ cm$^{-3}$ and not higher than $2\times10^{19}$ cm$^{-3}$ and preferably not lower than $2\times10^{18}$ cm$^{-3}$ and not higher than $9\times10^{18}$ cm$^{-3}$. First region 17c faces bottom portion B1 of trench T1 and a part of base region 13. First region 17c covers the entire bottom portion B1 of trench T1 and extends along a direction from side surface S1 of trench T1 toward base region 13. Preferably, first region 17c is arranged to cover the entire channel region CH in base region 13 in contact with gate insulating film 15. When viewed along a direction in parallel to second main surface 10b of silicon carbide substrate 10 (a field of view in FIG. 1), first region 17c is greater in width than bottom portion B1 of trench T1. First region 17c has a thickness, for example, not smaller than 0.5 µm and not greater than 1.5 µm.

Second region 17a is provided to face base region 13. Second region 17a is provided between base region 13 and second main surface 10b. Second region 17a may be in direct contact with base region 13 or may be spaced apart from base region 13. In the direction in parallel to second main surface 10b, second region 17a may be greater in width than contact region 18. Preferably, second region 17a is provided as being in contact with contact region 18 and base region 13. Second region 17a has a thickness, for example, not smaller than 0.5 µm and not greater than 1.5 µm.

Surface 17c1 of first region 17c facing second main surface 10b is located on the side of second main surface 10b in the direction perpendicular to second main surface 10b relative to surface 17a1 of second region 17a facing second main surface 10b. In other words, in the direction perpendicular to second main surface 10b, a distance between second main surface 10b and surface 17c1 of first region 17c is shorter than second main surface 10b and surface 17a1 of second region 17a. Embedded region 17 preferably further includes fifth region 17b which is located opposite to base region 13 when viewed from second region 17a and in contact with second region 17a. Fifth region 17b is provided as lying between second region 17a and fourth region 12c in drift region 12. Preferably, side surface 17a2 of second region 17a is provided to retract toward a side opposite to side surface S1 of trench T1 relative to side surface 17b2 of fifth region 17b. In the direction in parallel to second main surface 10b, second region 17a may be equal in width to fifth region 17b.

Preferably, distance a between base region 13 and first region 17c in the direction perpendicular to second main surface 10b is not smaller than 0.2 µm and not greater than 2 µm. Distance a is equal to a thickness of third region 12a in contact with base region 13. More preferably, distance a is not smaller than 0.5 µm and not greater than 0.7 µm.

Preferably, distance b between a point of contact between side surface S1 and bottom portion B1 of trench T1 and side surface 17c2 of first region 17c in the direction in parallel to second main surface 10b is not smaller than 0.1 µm and not greater than 0.5 µm. Distance b is equal to a width of first region 17c facing base region 13. More preferably, distance b is not smaller than 0.2 µm and not greater than 0.4 µm.

Preferably, distance c between side surface 17c2 of first region 17c and side surface 17a2 of second region 17a in the direction in parallel to second main surface 10b is not smaller than 0.6 µm and not greater than 1.5 µm. Distance c is equal to a value calculated by subtracting distance a from the width of third region 12a lying between side surface S1 of trench T1 and second region 17a. More preferably, distance c is not smaller than 0.7 µm and not greater than 1 µm.

Preferably, distance c between side surface 17c2 of first region 17c and side surface 17a2 of second region 17a in the direction in parallel to second main surface 10b is longer than a distance d between side surface 17c2 of first region 17c and side surface 17b2 of fifth region 17b. Distance d is equal to a width of sixth region 12b lying between first region 17c and fifth region 17b. Distance d in the direction in parallel to second main surface 10b is, for example, not smaller than 0.5 μm and not greater than 1.5 μm, preferably not smaller than 0.7 μm and not greater than 1.5 μm, and further preferably not smaller than 0.7 μm and not greater than 1.0 μm.

Figure 2:
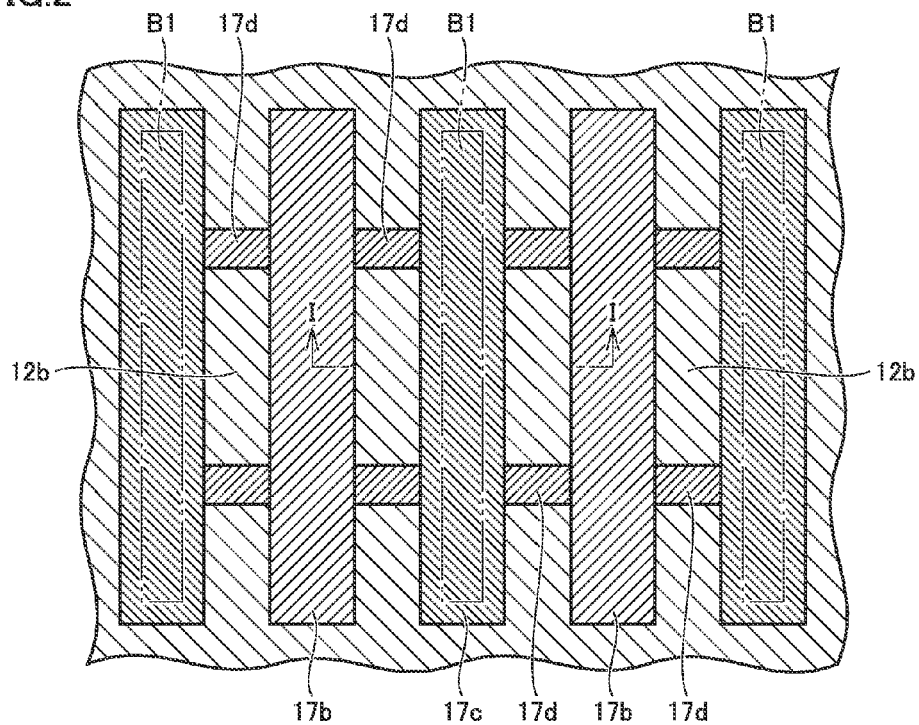
FIG. 2 is a lateral schematic cross-sectional view along a region II-II in FIG. 1.

Referring to FIG. 2, in a plan view (a field of view along the direction perpendicular to second main surface 10b), each of first region 17c and fifth region 17b is in an elongated (for example, rectangular) shape having, for example, a major axis and a minor axis. In the plan view, bottom portion B1 of trench T1 is arranged to be superimposed on first region 17c. Bottom portion B1 of trench T1 extends along a direction of the major axis of first region 17c. Embedded region 17 includes a connection portion 17d which connects first region 17c and fifth region 17b to each other. Connection portion 17d connects a part of one side in the direction of the major axis of first region 17c and a part of one side in the direction of the major axis of fifth region 17b when viewed in the direction perpendicular to second main surface 10b. Connection portion 17d contains a p-type impurity such as aluminum and has the p-type. In the plan view, sixth region 12b is arranged to be surrounded by first region 17c, fifth region 17b, and connection portion 17d. A plurality of connection portions 17d may be arranged along the direction of the major axis of first region 17c. A plurality of connection portions 17d may be arranged along a direction of a short side of first region 17c.

Referring to FIG. 1, third region 12a in drift region 12 is in contact with side surface S1 of trench T1, base region 13, first region 17c, and second region 17a. Fourth region 12c in drift region 12 is located on the side of second main surface 10b relative to third region 12a, electrically connected to third region 12a, and lower in impurity concentration than third region 12a. Sixth region 12b in drift region 12 is arranged as lying between third region 12a and fourth region 12c in the direction perpendicular to second main surface 10b and arranged as lying between first region 17c and fifth region 17b in the direction in parallel to second main surface 10b. Sixth region 12b is preferably higher in concentration of an n-type impurity than fourth region 12c. Preferably, an impurity concentration in each of third region 12a and sixth region 12b is not lower than $1 \times 10^{16}$ cm$^{-3}$ and not higher than $4 \times 10^{17}$ cm$^{-3}$ and more preferably not lower than $2 \times 10^{16}$ cm$^{-3}$ and not higher than $2 \times 10^{17}$ cm$^{-3}$. Sixth region 12b has a thickness, for example, not smaller than 0.4 μm and not greater than 1.5 μm. Third region 12a has a thickness, for example, not smaller than 0.2 μm and not greater than 1.0 μm.

A concentration of an impurity such as nitrogen contained in fourth region 12c and a thickness of fourth region 12c vary depending on a breakdown voltage. When a breakdown voltage is set to 1200 V, fourth region 12c has a thickness, for example, of approximately 10 μm and a concentration of nitrogen contained in fourth region 12c is approximately $1 \times 10^{16}$ cm$^{-3}$. When a breakdown voltage is set to 1700 V, fourth region 12c has a thickness, for example, of approximately 20 μm and a concentration of nitrogen contained in fourth region 12c is approximately $5 \times 10^{15}$ cm$^{-3}$. When a breakdown voltage is set to 3300 V, fourth region 12c has a thickness, for example, of approximately 30 μm and a concentration of nitrogen contained in fourth region 12c is approximately $3 \times 10^{15}$ cm$^{-3}$.

Preferably, a concentration of an n-type impurity such as nitrogen contained in buffer layer 22 is lower than a concentration of an n-type impurity such as nitrogen contained in silicon carbide single-crystal substrate 11. A concentration of an n-type impurity such as nitrogen contained in silicon carbide single-crystal substrate 11 is, for example, not lower than $5 \times 10^{18}$ cm$^{-3}$ and not higher than $9 \times 10^{18}$ cm$^{-3}$. A concentration of an n-type impurity such as nitrogen contained in buffer layer 22 is, for example, not lower than $1 \times 10^{18}$ cm$^{-3}$ and not higher than $2 \times 10^{18}$ cm$^{-3}$. An element and a concentration of an impurity contained in each impurity region can be measured, for example, with a scanning capacitance microscope (SCM) or secondary ion mass spectrometry (SIMS).

Gate insulating film 15 is composed, for example, of silicon dioxide and provided as being in contact with side surface S1 and bottom portion B1 of trench T1. Gate insulating film 15 is in contact with third region 12a, base region 13, and source region 14 at side surface S1 of trench T1 and in contact with third region 12a at bottom portion B1 of trench T1. Channel region CH can be formed in base region 13 in contact with gate insulating film 15. Gate insulating film 15 has a thickness, for example, not smaller than 50 nm and not greater than 150 nm.

Gate electrode 27 is provided on gate insulating film 15. Gate electrode 27 is arranged as being in contact with gate insulating film 15 and provided to bury a groove defined by gate insulating film 15. Gate electrode 27 may be provided at a position opposed to first main surface 10a. Gate electrode 27 is composed, for example, of a conductor such as polysilicon doped with an impurity.

Source electrode 16 is composed, for example, of a material containing Ni and Ti. Source electrode 16 is electrically connected to source region 14 on the side of first main surface 10a of silicon carbide substrate 10. Preferably, source electrode 16 is in contact with contact region 18. Source electrode 16 includes an alloy layer in ohmic contact with source region 14. The alloy layer is composed, for example, of a silicide with a metal contained in source electrode 16. Preferably, source electrode 16 is composed of a material containing Ti, Al, and Si.

Interlayer insulating film 21 is provided at a position opposed to first main surface 10a of silicon carbide substrate 10. Specifically, interlayer insulating film 21 is provided as being in contact with each of gate electrode 27 and gate insulating film 15 so as to cover gate electrode 27. Interlayer insulating film 21 includes, for example, a tetra ethyl ortho silicate (TEOS) oxide film and phosphorus silicon glass (PSG). Interlayer insulating film 21 electrically isolates gate electrode 27 and source electrode 16 from each other. Source interconnection 19 is provided to cover interlayer insulating film 21 and to be in contact with source electrode 16. Source interconnection 19 is electrically connected to source region 14 with source electrode 16 being interposed. Source interconnection 19 is composed of a material containing, for example, AlSiCu. Protecting film 24 is provided on source interconnection 19 so as to cover source interconnection 19. Protecting film 24 includes, for example, a nitride film and polyimide.

Drain electrode 20 is provided as being in contact with second main surface 10b of silicon carbide substrate 10. Drain electrode 20 is electrically connected to fourth region 12c on the side of second main surface 10b. Drain electrode 20 is composed of a material such as nickel silicide (NiSi) which can establish ohmic contact with n-type silicon carbide single-crystal substrate 11. Drain electrode 20 is thus electrically connected to silicon carbide single-crystal substrate 11.

An operation of MOSFET 1 according to the first embodiment will now be described. Referring to FIG. 1, when a voltage applied to gate electrode 27 is lower than a threshold voltage, that is, in an off state, even with application of a voltage across source electrode 16 and drain electrode 20, a pn junction formed between base region 13 and first impurity region 12 is reverse biased and is in a non-conducting state. When a voltage not lower than the threshold voltage is applied to gate electrode 27, an inversion layer is formed in channel region CH which is around a portion in base region 13 in contact with gate insulating layer 15. Consequently, source region 14 and first impurity region 12 are electrically connected to each other and a current flows between source electrode 16 and drain electrode 20. MOSFET 1 operates as above.

A method for manufacturing MOSFET 1 as the silicon carbide semiconductor device according to the first embodiment will now be described.

Referring to FIG. 4, silicon carbide single-crystal substrate 11 is prepared, for example, by cutting a substrate by slicing a silicon carbide single-crystal ingot grown with an improved Raleigh method and mirror polishing a surface of the substrate. Silicon carbide single-crystal substrate 11 is composed, for example, of hexagonal silicon carbide having a polytype of 4H. A main surface of silicon carbide single-crystal substrate 11 has a diameter, for example, of 150 mm and a thickness, for example, of 400 μm. The main surface of silicon carbide single-crystal substrate 11 is, for example, a {0001} plane or a surface angled off by not greater than 8° from the {0001} plane.

Figure 3:
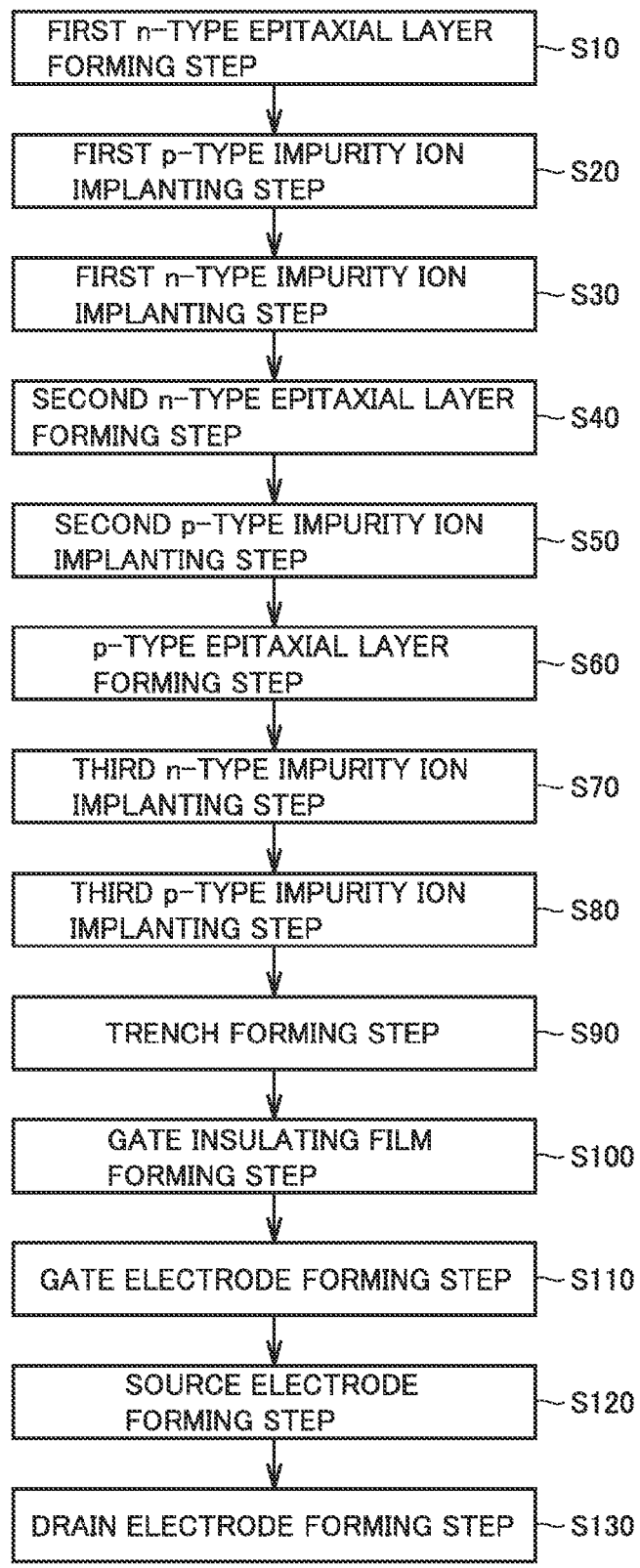
FIG. 3 is a flowchart for schematically illustrating a method for manufacturing the silicon carbide semiconductor device according to the first embodiment of the present invention.

Then, a first n-type epitaxial layer forming step (S10: FIG. 3) is performed. For example, a carrier gas containing hydrogen, a source material gas containing silane and propane, and a dopant gas containing nitrogen are supplied over silicon carbide single-crystal substrate 11, and silicon carbide single-crystal substrate 11 is heated, for example, to a temperature around 1550° C. under a pressure of 100 mbar (10 kPa). Thus, as shown in FIG. 5, a silicon carbide epitaxial layer having the n-type is formed on silicon carbide single-crystal substrate 11. The silicon carbide epitaxial layer has buffer layer 22 formed on silicon carbide single-crystal substrate 11 and has fourth region 12c formed on buffer layer 22. Fourth region 12c is doped with nitrogen at a concentration, for example, of $8.0 \times 10^{15}$ cm$^{-3}$. Fourth region 12c has a thickness, for example, of 10 μm.

Figure 7:
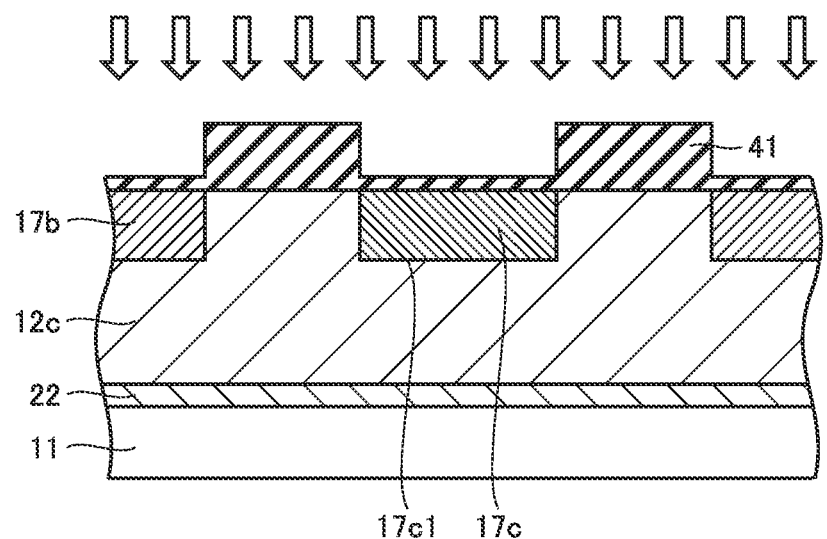
FIG. 7 is a schematic cross-sectional view for schematically illustrating a fourth step in the method for manufacturing the silicon carbide semiconductor device according to the first embodiment of the present invention.

Then, a first p-type impurity ion implanting step (S20: FIG. 3) is performed. Specifically, referring to FIG. 6, an ion implantation mask 41 is formed on fourth region 12c of silicon carbide epitaxial layer 5. Ion implantation mask 41 is composed of a material including a TEOS oxide film and has a thickness, for example, of 1.6 μm. Then, ion implantation mask 41 is subjected to radio frequency (RF) etching using CHF$_3$ and O$_2$. Thus, a through film (a thin region of ion implantation mask 41 in FIG. 6), for example, of approximately 80 nm is left on a portion into which ions are to be implanted. Then, using ion implantation mask 41 having the through film, ions are implanted into fourth region 12c in silicon carbide epitaxial layer 5. For example, aluminum (Al) ions are implanted into silicon carbide epitaxial layer 5 through the through film in a direction shown with an arrow, so that first region 17c and fifth region 17b having the p-type and being higher in impurity concentration than base region 13 are formed (see FIG. 7). A concentration of a p-type impurity such as aluminum contained in each of first region 17c and fifth region 17b is, for example, not lower than $2 \times 10^{18}$ cm$^{-3}$ and not higher than $9 \times 10^{18}$ cm$^{-3}$. A thickness of each of first region 17c and fifth region 17b is, for example, not smaller than 0.5 μm and not greater than 1.5 μm.

Figure 8:
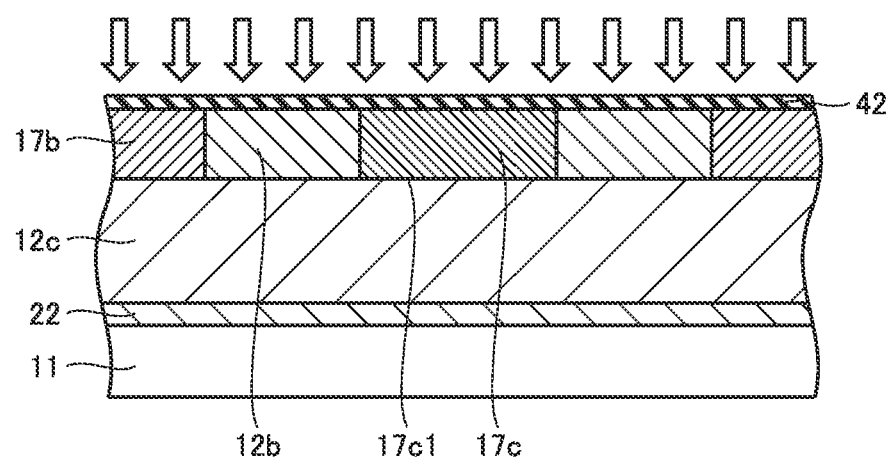
FIG. 8 is a schematic cross-sectional view for schematically illustrating a fifth step in the method for manufacturing the silicon carbide semiconductor device according to the first embodiment of the present invention.

Then, a first n-type impurity ion implanting step (S30: FIG. 3) is performed. Specifically, after ion implantation mask 41 is removed, for example, a through film 42 having a thickness of 80 nm is formed as being in contact with first region 17c, fifth region 17b, and fourth region 12c. Then, for example, nitrogen ions are implanted into first region 17c, fifth region 17b, and fourth region 12c from above through film 42 in a direction shown with an arrow. Thus, in a cross-sectional view, sixth region 12b having the n-type and being higher in impurity concentration than fourth region 12c is formed in a region lying between first region 17c and fifth region 17b. A concentration of an n-type impurity such as nitrogen contained in sixth region 12b is, for example, not lower than $1 \times 10^{16}$ cm$^{-3}$ and not higher than $7 \times 10^{16}$ cm$^{-3}$. Sixth region 12b has a thickness, for example, not smaller than 0.5 μm and not greater than 1.0 μm (see FIG. 8). Then, through film 42 formed on first region 17c, fifth region 17b, and sixth region 12b is removed.

Then, a second n-type epitaxial layer forming step (S40: FIG. 3) is performed. Specifically, third region 12a is formed through epitaxial growth while doping with an n-type impurity such as nitrogen is performed. A concentration of the n-type impurity such as nitrogen contained in third region 12a is, for example, not lower than $1 \times 10^{16}$ cm$^{-3}$ and not higher than $7 \times 10^{16}$ cm$^{-3}$. Third region 12a is formed as being in contact with first region 17c, fifth region 17b, and sixth region 12b. Third region 12a has a thickness, for example, not smaller than 0.3 μm and not greater than 1.0 μm. Third region 12a may be formed, for example, as a result of implantation of ions of an n-type impurity such as nitrogen or phosphorus into a silicon carbide epitaxial region such as fourth region 12c.

Figure 9:
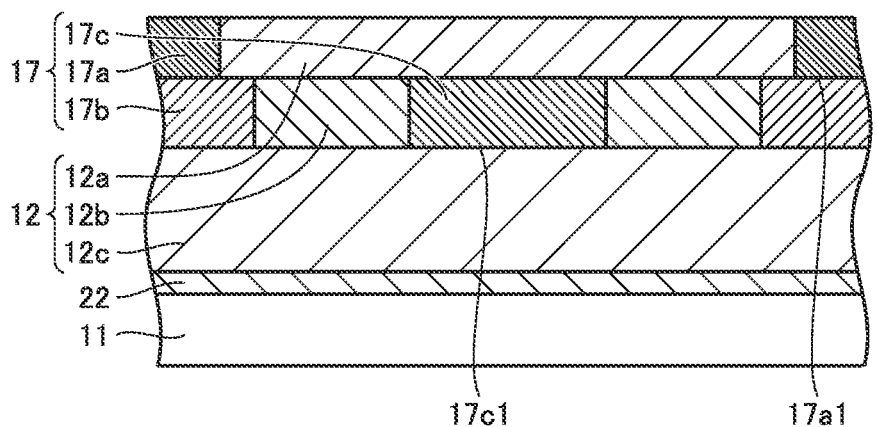
FIG. 9 is a schematic cross-sectional view for schematically illustrating a sixth step in the method for manufacturing the silicon carbide semiconductor device according to the first embodiment of the present invention.

Then, a second p-type impurity ion implanting step (S50: FIG. 3) is performed. Ions are implanted into a part of third region 12a in silicon carbide epitaxial layer 5. As a result of implantation of ions of a p-type impurity such as aluminum into a part of third region 12a, second region 17a which is in contact with fifth region 17b and has the p-type is formed (see FIG. 9). A concentration of a p-type impurity such as aluminum contained in second region 17a is, for example, not lower than $2 \times 10^{18}$ cm$^{-3}$ and not higher than $9 \times 10^{18}$ cm$^{-3}$. Second region 17a has a thickness, for example, not smaller than 0.5 μm and not greater than 1.0 μm.

Then, a p-type epitaxial layer forming step (S60: FIG. 3) is performed. Specifically, base region 13 is formed through epitaxial growth while doping with a p-type impurity such as aluminum is performed. A concentration of a p-type impurity such as aluminum contained in base region 13 is, for example, not lower than $5 \times 10^{15}$ cm$^{-3}$ and not higher than $1 \times 10^{17}$ cm$^{-3}$. Base region 13 is formed to be in contact with both of second region 17a and third region 12a (see FIG. 10). Base region 13 has a thickness, for example, not smaller than 0.5 μm and not greater than 1.5 μm Base region 13 may be formed, for example, as a result of implantation of ions of a p-type impurity such as aluminum into the silicon carbide epitaxial layer such as fourth region 12c or third region 12a.

Then, a third n-type impurity ion implanting step (S70: FIG. 3) is performed. Specifically, ions are implanted into base region 13 in silicon carbide epitaxial layer 5. As a result of implantation of ions of an n-type impurity such as phosphorus into base region 13 in silicon carbide epitaxial layer 5 in a direction of an arrow, source region 14 having the n-type is formed. Ions of an n-type impurity may be implanted by using a through film 43 formed on base region 13.

Figure 11:
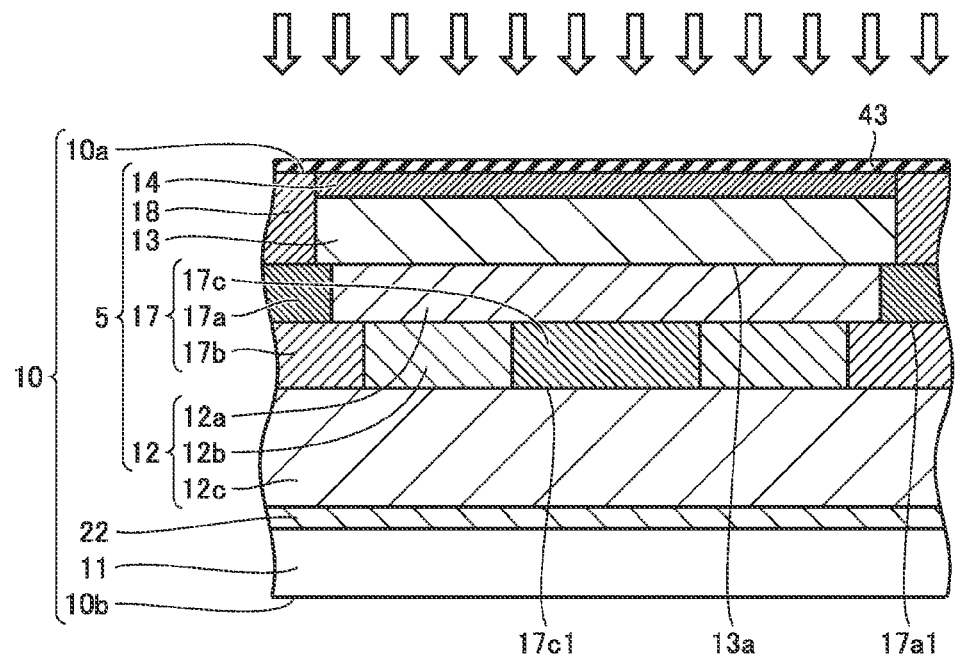
FIG. 11 is a schematic cross-sectional view for schematically illustrating an eighth step in the method for manufacturing the silicon carbide semiconductor device according to the first embodiment of the present invention.

A third p-type impurity ion implanting step (S80: FIG. 3) is performed. Specifically, an ion implantation mask is formed on base region 13 and source region 14. The ion implantation mask is composed, for example, of a material including an oxide film. Then, ions are implanted into base region 13 and source region 14 in silicon carbide epitaxial layer 5. For example, aluminum ions are implanted into base region 13 and source region 14 to a depth reaching second region 17a. Thus, contact region 18 which lies between source regions 14 and between base regions 13, is formed to connect first main surface 10a of silicon carbide substrate 10 and second region 17a to each other, and has the p conductivity type is formed (see FIG. 11).

Then, an activation annealing step is performed. After the ion implantation mask is removed from first main surface 10a of silicon carbide substrate 10, first main surface 10a of silicon carbide substrate 10 is covered with a protecting film 43. Then, silicon carbide substrate 10 is heated in an argon atmosphere at a temperature, for example, not lower than 1600° C. and not higher than 1750° C. approximately for a period not shorter than 5 minutes and not longer than 30 minutes. Thus, the p-type impurity such as aluminum contained in base region 13, the n-type impurity such as phosphorus contained in source region 14, the p-type impurity such as aluminum contained in contact region 18, the n-type impurity such as nitrogen contained in sixth region 12b, and the p-type impurity such as aluminum contained in embedded region 17 are activated.

Figure 12:
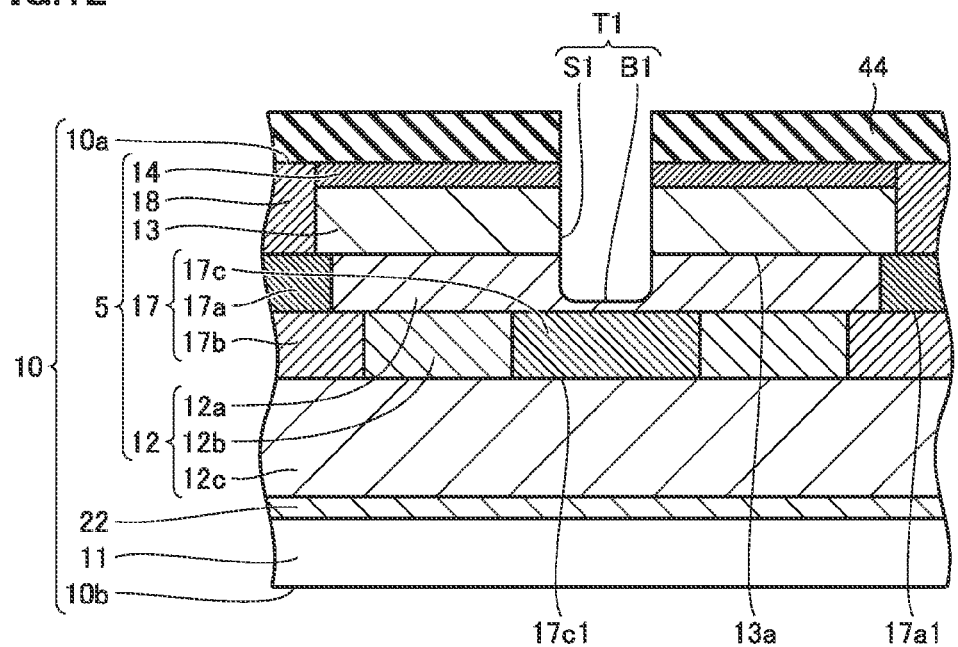
FIG. 12 is a schematic cross-sectional view for schematically illustrating a ninth step in the method for manufacturing the silicon carbide semiconductor device according to the first embodiment of the present invention.

Then, a trench forming step (S90: FIG. 3) is performed. Referring to FIG. 12, an etching mask 44 is formed on source region 14 and contact region 18. Etching mask 44 is composed of a material including, for example, a TEOS oxide film, and etching mask 44 has a thickness, for example, of 1.6 μm. Then, an opening is provided in etching mask 44 as a result of RF etching with $CHF_3$ and $O_2$ of etching mask 44 over a region where trench T1 is to be provided. Then, silicon carbide substrate 10 is etched by using etching mask 44 having the opening provided over a region where trench T1 is to be formed. For example, silicon carbide substrate 10 is subjected to electron cyclotron resonance (ECR) plasma etching with $SF_6$ and $O_2$. Thus, trench T1 having side surface S1 continuous to first main surface 10a of silicon carbide substrate 10 and bottom portion B1 continuous to side surface S1 is formed. Source region 14, base region 13, and third region 12a are exposed at side surface S1 of trench T1 and third region 12a is exposed at bottom portion B1 of trench T1. Trench T1 has a depth, for example, not smaller than 0.5 μm and not greater than 2.3 μm Trench T1 has a width, for example, not smaller than 0.5 μm and not greater than 3 μm.

As above, silicon carbide substrate 10 having first main surface 10a and second main surface 10b opposite to first main surface 10a is prepared. Silicon carbide substrate 10 includes drift region 12 having the n-type, base region 13 which is in contact with drift region 12 and has the p-type different from the n-type, source region 14 which has the n-type and is spaced apart from drift region 12 by base region 13, and embedded region 17 which has the p-type and is higher in impurity concentration than base region 13. First main surface 10a of silicon carbide substrate 10 has trench T1 provided, trench T1 having side surface S1 continuous to first main surface 10a and bottom portion B1 continuous to side surface S1. Embedded region 17 includes first region 17c facing bottom portion B1 of trench T1 and a part of base region 13 and second region 17a facing base region 13. Drift region 12 includes third region 12a in contact with side surface S1 of trench T1, base region 13, first region 17c, and second region 17a and fourth region 12c which is located on the side of second main surface 10b relative to third region 12a, electrically connected to third region 12a, and lower in impurity concentration than third region 12a. Surface 17c1 of first region 17c facing second main surface 10b is located on the side of second main surface 10b in the direction perpendicular to second main surface 10b relative to surface 17a1 of second region 17a facing second main surface 10b.

Embedded region 17 further includes fifth region 17b which is located opposite to base region 13 when viewed from second region 17a and is in contact with second region 17a. Side surface 17a2 of second region 17a is provided to retract toward the side opposite to side surface S1 of trench T1 relative to side surface 17b2 of fifth region 17b. Distance a between base region 13 and first region 17c in the direction perpendicular to second main surface 10b is not smaller than 0.5 μm and not greater than 2 μm. Distance b between the point of contact between side surface S1 and bottom portion B1 of trench T1 and side surface 17c2 of first region 17c in the direction in parallel to second main surface 10b is not smaller than 0.1 μm and not greater than 0.5 μm Distance c between side surface 17c2 of first region 17c and side surface 17a2 of second region 17a in the direction in parallel to second main surface 10b is not smaller than 0.6 μm and not greater than 1.5 μm. Then, a gate insulating film forming step (S100: FIG. 3) is performed.

Figure 13:
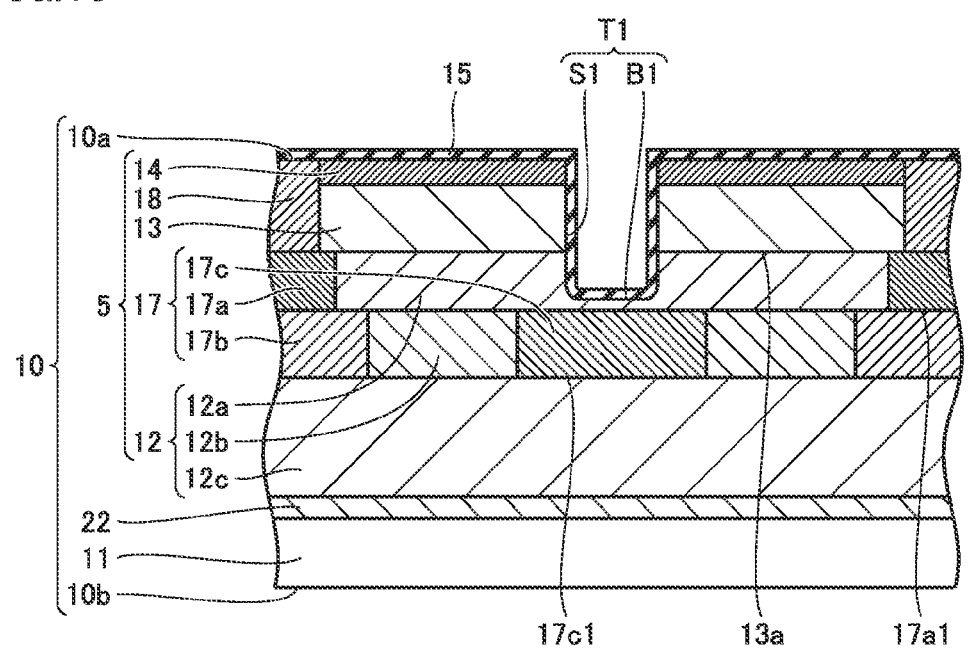
FIG. 13 is a schematic cross-sectional view for schematically illustrating a tenth step in the method for manufacturing the silicon carbide semiconductor device according to the first embodiment of the present invention.

Specifically, after mask 44 is removed, silicon carbide substrate 10 having trench T1 provided in first main surface 10a is arranged in a heating furnace. By introducing oxygen into the heating furnace and dry oxidizing silicon carbide substrate 10 at a temperature, for example, not lower than 1100° C. and not higher than 1300° C., gate insulating film 15 in contact with side surface S1 and bottom portion B1 of trench T1 is formed (see FIG. 13). Gate insulating film 15 is in contact with third region 12a, base region 13, and source region 14 at side surface S1 of trench T1 and is in contact with third region 12a at bottom portion B1 of trench T1. Gate insulating film 15 is in contact with source region 14 and contact region 18 at first surface 10a. Gate insulating film 15 has a thickness, for example, not smaller than 50 nm and not greater than 150 nm. Gate insulating film 15 may be a deposited oxide film.

Then, an NO annealing step is performed. Specifically, silicon carbide substrate 10 having gate insulating film 15 formed on first main surface 10a is subjected to heat treatment at a temperature, for example, not lower than 1100° C. and not higher than 1300° C. in an atmosphere containing nitrogen. Examples of a gas containing nitrogen include, for example, nitrous oxide diluted by 10% with nitrogen. Preferably, silicon carbide substrate 10 having gate insulating film 15 formed is held in the gas containing nitrogen, for example, for a period not shorter than 30 minutes and not longer than 360 minutes.

Then, a gate electrode forming step (S110: FIG. 3) is performed. Specifically, gate electrode 27 is formed on gate insulating film 15 so as to bury a groove defined by gate insulating film 15. Gate electrode 27 is composed, for example, of a material containing polysilicon containing an impurity. Then, interlayer insulating film 21 is formed to cover gate electrode 27. Interlayer insulating film 21 includes, for example, a TEOS oxide film and PSG.

Then, a source electrode forming step (S120: FIG. 3) is performed. Specifically, as a result of removal of interlayer insulating film 21 and gate insulating film 15 in a region where source electrode 16 is to be formed, each of source region 14 and contact region 18 is exposed through interlayer insulating film 21. Then, source electrode 16 is formed, for example, through sputtering so as to be in contact with both of source region 14 and contact region 18 at first main surface 10a of silicon carbide substrate 10. Source electrode 16 contains, for example, Ni and Ti. Source electrode 16 may be composed of a material containing TiAlSi. Then, silicon carbide substrate 10 having source electrode 16 formed, source electrode 16 being provided to be in contact with each of source region 14 and contact region 18 at first main surface 10a of silicon carbide substrate 10, is subjected to rapid thermal anneal (RTA) for approximately 2 minutes, for example, at a temperature not lower than 900° C. and not higher than 1100° C. Thus, at least a part of source electrode 16 reacts with silicon contained in the silicon carbide substrate and silicided. Thus, source electrode 16 in ohmic contact with source region 14 is formed. Preferably, source electrode 16 is in ohmic contact with each of source region 14 and contact region 18. As above, source electrode 16 electrically connected to source region 14 on the side of first main surface 10a is formed. Embedded region 17 is electrically connected to source electrode 16.

Referring to FIG. 1, source interconnection 19 is formed to be in contact with source electrode 16 and to cover interlayer insulating film 21. Source interconnection 19 is preferably composed of a material containing Al and composed, for example, of a material containing AlSiCu. Then, protecting film 24 is formed to cover source interconnection 19. Protecting film 24 is composed, for example, of a material including a nitride film and polyimide.

Then, a drain electrode forming step (S130: FIG. 3) is performed. Specifically, drain electrode 20 composed, for example, of NiSi is formed as being in contact with second main surface 10b of silicon carbide substrate 10. Drain electrode 20 may be composed, for example, of TiAlSi. Drain electrode 20 is formed, for example, through sputtering, however, it may be formed through vapor deposition. After drain electrode 20 is formed, drain electrode 20 is heated, for example, through laser annealing. Thus, at least a part of drain electrode 20 is silicided and comes in ohmic contact with silicon carbide single-crystal substrate 11, so that drain electrode 20 electrically connected to fourth region 12c on the side of second main surface 10b is formed. MOSFET 1 shown in FIG. 1 is manufactured as above.

A modification of the method for manufacturing MOSFET 1 as the silicon carbide semiconductor device according to the first embodiment will now be described.

Referring to FIG. 4, silicon carbide single-crystal substrate 11 is prepared, for example, by cutting a substrate by slicing a silicon carbide single-crystal ingot grown with the improved Raleigh method and mirror polishing a surface of the substrate. Silicon carbide single-crystal substrate 11 is composed, for example, of hexagonal silicon carbide having a polytype of 4H. A main surface of silicon carbide single-crystal substrate 11 has a diameter, for example, of 150 mm and a thickness, for example, of 400 µm. The main surface of silicon carbide single-crystal substrate 11 is, for example, a {0001} plane or a surface angled off by not greater than 8° from the {0001} plane.

Then, the first n-type epitaxial layer forming step is performed. For example, a carrier gas containing hydrogen, a source material gas containing silane and propane, and a dopant gas containing nitrogen are supplied over silicon carbide single-crystal substrate 11, and silicon carbide single-crystal substrate 11 is heated, for example, to a temperature around 1550° C. under a pressure of 100 mbar (10 kPa). Thus, as shown in FIG. 5, a silicon carbide epitaxial layer having the n-type is formed on silicon carbide single-crystal substrate 11. The silicon carbide epitaxial layer has buffer layer 22 formed on silicon carbide single-crystal substrate 11 and has fourth region 12c formed on buffer layer 22. Fourth region 12c is doped with nitrogen at a concentration, for example, of $8.0 \times 10^{15}$ cm$^{-3}$. Fourth region 12c has a thickness, for example, of 10 µm. As above, fourth region 12c is formed on buffer layer 22 through epitaxial growth.

Figure 14:
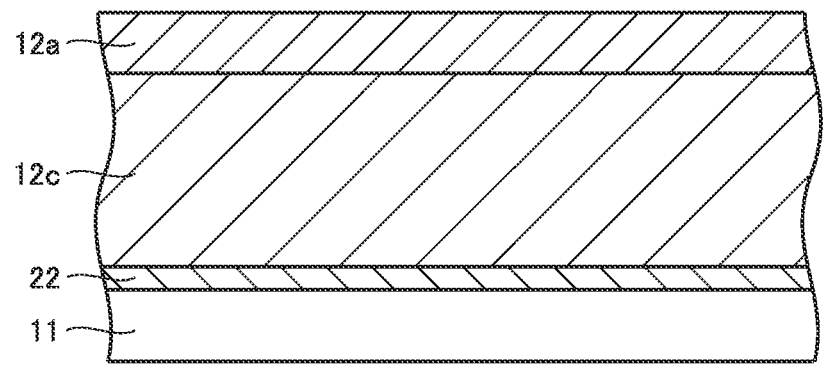
FIG. 14 is a schematic cross-sectional view for schematically illustrating a first step in a modification of the method for manufacturing the silicon carbide semiconductor device according to the first embodiment of the present invention.

Then, the second n-type epitaxial layer forming step is performed. Specifically, third region 12a is formed through epitaxial growth so as to cover fourth region 12c while doping with an n-type impurity such as nitrogen is performed. A concentration of an n-type impurity such as nitrogen contained in third region 12a is, for example, not lower than $1 \times 10^{16}$ cm$^{-3}$ and not higher than $7 \times 10^{16}$ cm$^{-3}$. Third region 12a is formed as being in contact with fourth region 12c. Third region 12a has a thickness, for example, not smaller than 0.3 µm and not greater than 1.0 µm. As above, third region 12a is formed on fourth region 12c through epitaxial growth (see FIG. 14).

Figure 15:
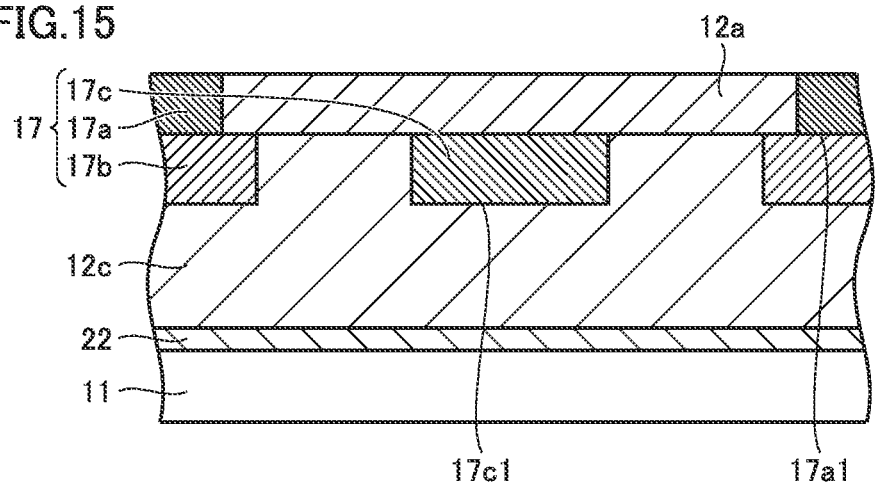
FIG. 15 is a schematic cross-sectional view for schematically illustrating a second step in the modification of the method for manufacturing the silicon carbide semiconductor device according to the first embodiment of the present invention.

Then, a p-type impurity ion implanting step is performed. Specifically, an ion implantation mask (not shown) is formed on third region 12a. Ions are implanted into fourth region 12c in silicon carbide epitaxial layer 5 through the ion implantation mask. For example, aluminum ions are implanted into fourth region 12c with first implantation energy so that first region 17c and fifth region 17b in contact with fourth region 12c are formed. Then, an ion implantation mask (not shown) having an opening over a region where second region 17a is to be formed is formed on third region 12a. Ions are implanted into third region 12a through the ion implantation mask. For example, aluminum ions are implanted into third region 12a with second implantation energy lower than the first implantation energy, so that second region 17a in contact with fifth region 17b and third region 12a is formed (see FIG. 15). First implantation energy and second implantation energy are set, for example, to 900 keV and 700 keV, respectively. Though an example in which second region 17a is formed after first region 17c is formed is described above, first region 17c may be formed after second region 17a is formed.

Figure 10:
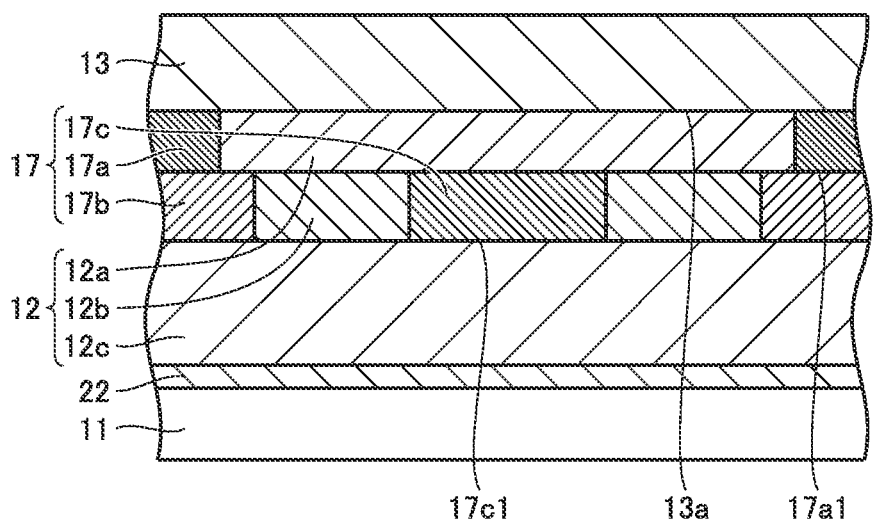
FIG. 10 is a schematic cross-sectional view for schematically illustrating a seventh step in the method for manufacturing the silicon carbide semiconductor device according to the first embodiment of the present invention.

Then, base region 13 is formed as being in contact with second region 17a and third region 12a through epitaxial growth (see FIG. 10). Subsequent steps are the same as described above.

A function and effect of MOSFET 1 as the silicon carbide semiconductor device and the method for manufacturing the same according to the first embodiment will now be described.

According to MOSFET 1 according to the first embodiment, embedded region 17 includes first region 17c facing bottom portion B1 of trench T1 and a part of base region 13 and second region 17a facing base region 13. Surface 17c1 of first region 17c which faces second main surface 10b is located on the side of second main surface 10b in the direction perpendicular to second main surface 10b relative to surface 17a1 of the second region which faces second main surface 10b. Exposure of base region 13 to high electric field can thus be suppressed. Since third region 12a is higher in impurity concentration than fourth region 12c, an on-resistance can be lowered. By providing first region 17c facing bottom portion B1 of trench T1 and a part of base region 13, application of high electric field to gate insulating film 15 in contact with side surface S1 and bottom portion B1 of trench T1 and degradation or breakdown of gate insulating film 15 can be suppressed. In particular, a portion of base region 13 where avalanche occurs is spaced apart from gate insulating film 15, so that degradation or breakdown of gate insulating film 15 at the time when avalanche occurs can effectively be suppressed. Consequently, highly reliable MOSFET 1 can be obtained.

In MOSFET 1 according to the first embodiment, embedded region 17 further includes fifth region 17b which is located opposite to base region 13 when viewed from second region 17a and is in contact with second region 17a. Exposure of base region 13 to high electric field can thus effectively be suppressed.

In MOSFET 1 according to the first embodiment, side surface 17a2 of second region 17a is provided to retract toward the side opposite to side surface S1 of trench T1 relative to side surface 17b2 of fifth region 17b. Thus, electric field is once narrowed by first region 17c and fifth region 17b and then electric field is spread by second region 17a in the direction in parallel to first main surface 10a so that intensity of electric field applied to base region 13 can be reduced.

In MOSFET 1 according to the first embodiment, distance a between base region 13 and first region 17c in the direction perpendicular to second main surface 10b is not smaller than 0.2 μm and not greater than 2 μm. Thus, MOSFET 1 which is low in characteristic on-resistance while it maintains a high breakdown voltage can be obtained.

In MOSFET 1 according to the first embodiment, distance b between the point of contact between side surface S1 and bottom portion B1 of trench T1 and side surface 17c2 of first region 17c in the direction in parallel to second main surface 10b is not smaller than 0.1 μm and not greater than 0.5 μm Thus, MOSFET 1 which is low in characteristic on-resistance while it maintains low intensity of electric field applied to gate insulating film 15 can be obtained.

In MOSFET 1 according to the first embodiment, distance c between side surface 17c2 of first region 17c and side surface 17a2 of second region 17a in the direction in parallel to second main surface 10b is not smaller than 0.6 μm and not greater than 1.5 μm Thus, MOSFET 1 which is low in characteristic on-resistance while it maintains a high breakdown voltage can be obtained.

In MOSFET 1 according to the first embodiment, a concentration of an impurity in third region 12a is not lower than $1 \times 10^{16}$ cm$^{-3}$ and not higher than $4 \times 10^{17}$ cm$^{-3}$. Thus, MOSFET 1 low in characteristic on-resistance can be obtained.

In MOSFET 1 according to the first embodiment, a concentration of an impurity in base region 13 is not lower than $1 \times 10^{15}$ cm$^{-3}$ and not higher than $4 \times 10^{17}$ cm$^{-3}$. Thus, MOSFET 1 low in characteristic on-resistance can be obtained.

According to the method for manufacturing MOSFET 1 according to the first embodiment, embedded region 17 includes first region 17c facing bottom portion B1 of trench T1 and a part of base region 13 and second region 17a facing base region 13. Surface 17c1 of first region 17c which faces second main surface 10b is located on the side of second main surface 10b in the direction perpendicular to second main surface 10b relative to surface 17a1 of the second region which faces second main surface 10b. Exposure of base region 13 to high electric field can thus be suppressed. By providing first region 17c facing bottom portion B1 of trench T1 and a part of base region 13, application of high electric field to gate insulating film 15 in contact with side surface S1 and bottom portion B1 of trench T1 and degradation or breakdown of gate insulating film 15 can be suppressed. In particular, a portion of base region 13 where avalanche occurs is spaced apart from gate insulating film 15, so that degradation or breakdown of gate insulating film 15 at the time when avalanche occurs can effectively be suppressed. Consequently, highly reliable MOSFET 1 can be obtained.

According to the method for manufacturing MOSFET 1 according to the first embodiment, forming silicon carbide substrate 10 includes forming fourth region 12c through epitaxial growth, forming first region 17c by implanting ions into fourth region 12c, forming third region 12a on first region 17c through epitaxial growth, and forming second region 17a by implanting ions into third region 12a. Thus, first region 17c and second region 17a high in impurity concentration can effectively be formed.

According to the method for manufacturing MOSFET 1 according to the first embodiment, forming silicon carbide substrate 10 further includes forming sixth region 12b which has the first conductivity type and is higher in impurity concentration than fourth region 12c by implanting ions into fourth region 12c. In forming third region 12a, third region 12a is formed on each of first region 17c and sixth region 12b. Thus, a characteristic on-resistance can be lowered.

According to the method for manufacturing MOSFET 1 according to the first embodiment, forming silicon carbide substrate 10 includes forming fourth region 12c through epitaxial growth, forming third region 12a on fourth region 12c through epitaxial growth, forming first region 17c in contact with fourth region 12c by implanting ions into fourth region 12c with first implantation energy, and forming second region 17a in contact with third region 12a by implanting ions into third region 12a with second implantation energy lower than the first implantation energy. Thus, first region 17c and second region 17a can be formed with a simplified method.

According to the method for manufacturing MOSFET 1 according to the first embodiment, forming silicon carbide substrate 10 further includes forming base region 13 in contact with both of second region 17a and third region 12a through epitaxial growth. Thus, base region 13 uniform in impurity concentration can be formed.

According to the method for manufacturing MOSFET 1 according to the first embodiment, embedded region 17 further includes fifth region 17b which is located opposite to base region 13 when viewed from second region 17a and is in contact with second region 17a. Thus, exposure of base region 13 to high electric field can effectively be suppressed.

According to the method for manufacturing MOSFET 1 according to the first embodiment, side surface 17a2 of second region 17a is provided to retract toward the side opposite to side surface S1 of trench T1 relative to side surface 17b2 of fifth region 17b. Thus, electric field is once narrowed by first region 17c and fifth region 17b and then electric field is spread by second region 17a in the direction in parallel to first main surface 10a so that intensity of electric field applied to base region 13 can be reduced.

According to the method for manufacturing MOSFET 1 according to the first embodiment, distance a between base region 13 and first region 17c in the direction perpendicular to second main surface 10b is not smaller than 0.2 μm and not greater than 2 μm. Thus, MOSFET 1 which is low in characteristic on-resistance while it maintains a high breakdown voltage can be obtained.

According to the method for manufacturing MOSFET 1 according to the first embodiment, distance b between the point of contact between side surface S1 and bottom portion B1 of trench T1 and side surface 17c2 of first region 17c in the direction in parallel to second main surface 10b is not smaller than 0.1 μm and not greater than 0.5 μm. Thus, MOSFET 1 which is low in characteristic on-resistance while it maintains low intensity of electric field applied to gate insulating film 15 can be obtained.

According to the method for manufacturing MOSFET 1 according to the first embodiment, distance c from side surface 17a2 of second region 17a is not smaller than 0.6 μm and not greater than 1.5 μm. Thus, MOSFET 1 which is low in characteristic on-resistance while it maintains a high breakdown voltage can be obtained.

According to the method for manufacturing MOSFET 1 according to the first embodiment, third region 12a is formed by implantation of ions. Thus, it is not necessary to interpose an epitaxial step during fabrication of a device, a process can be simplified, and a construction time can be decreased.

According to the method for manufacturing MOSFET 1 according to the first embodiment, base region 13 is formed by implantation of ions. Thus, it is not necessary to interpose an epitaxial step during fabrication of a device, a process can be simplified, and a construction time can be decreased.

Second Embodiment

A construction of a MOSFET as a silicon carbide semiconductor device according to a second embodiment of the present invention will now be described. The MOSFET according to the second embodiment is different from the MOSFET according to the first embodiment in that side surface 17a2 of second region 17a is provided to protrude toward side surface S1 of trench T1 relative to side surface 17b2 of fifth region 17b, and other features are substantially the same as those of the MOSFET according to the first embodiment. Therefore, the same or corresponding elements have the same reference characters allotted and description thereof will not be repeated.

Figure 16:
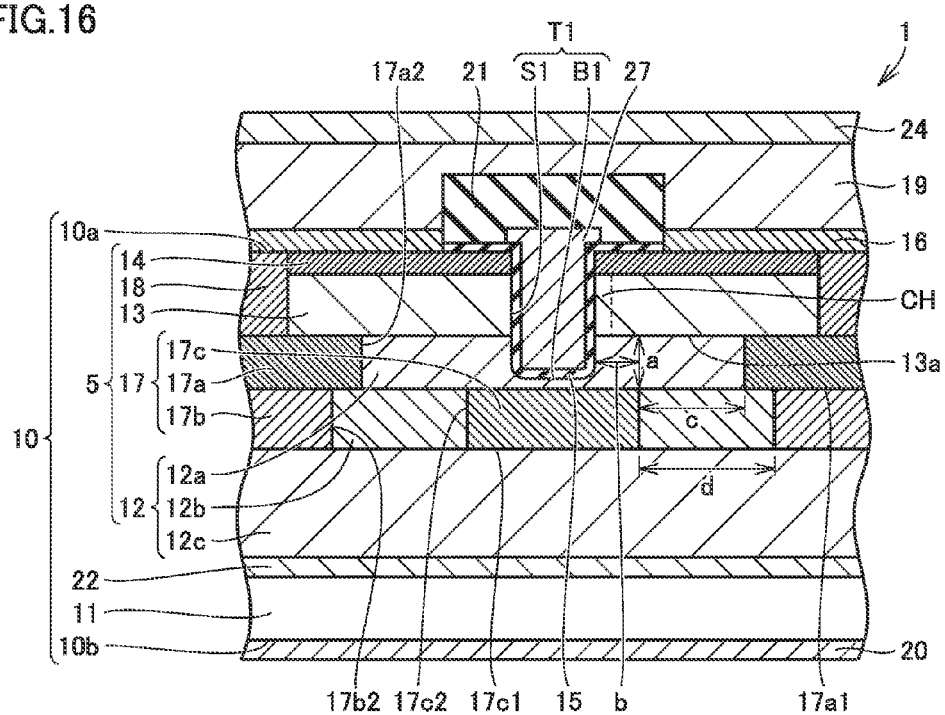
FIG. 16 is a schematic cross-sectional view for schematically illustrating a structure of a silicon carbide semiconductor device according to a second embodiment of the present invention.

Referring to FIG. 16, side surface 17a2 of second region 17a in embedded region 17 is provided to protrude toward side surface S1 of trench T1 relative to side surface 17b2 of fifth region 17b. In this case, second region 17a is in contact with sixth region 12b. Second region 17a is provided as lying between base region 13 and sixth region 12b in the direction perpendicular to second main surface 10b. Distance c between side surface 17c2 of first region 17c and side surface 17a2 of second region 17a in the direction in parallel to second main surface 10b is shorter than distance d between side surface 17c2 of first region 17c and side surface 17b2 of fifth region 17b.

In the MOSFET according to the second embodiment, in the second p-type impurity ion implanting step (S50: FIG. 3) in the first embodiment, ions of a p-type impurity such as aluminum are implanted into third region 12a through an ion implantation mask having a width of an opening greater than fifth region 17b, so that second region 17a is formed. Thus, second region 17a of which side surface 17a2 protrudes toward side surface S1 of trench T1 relative to side surface 17b2 of fifth region 17b is formed. Other steps are substantially the same as those in the method for manufacturing the MOSFET in the first embodiment.

A function and effect of MOSFET 1 as the silicon carbide semiconductor device according to the second embodiment will now be described.

According to MOSFET 1 according to the second embodiment, side surface 17a2 of second region 17a is provided to protrude toward side surface S1 of trench T1 relative to side surface 17b2 of fifth region 17b. Thus, electric field is once narrowed by first region 17c and fifth region 17b and then electric field is further narrowed by second region 17a, so that high electric field can be prevented from being directly applied to base region 13.

In the method for manufacturing MOSFET 1 according to the second embodiment, side surface 17a2 of second region 17a is provided to protrude toward side surface S1 of trench T1 relative to side surface 17b2 of fifth region 17b. Thus, electric field is once narrowed by first region 17c and fifth region 17b and then electric field is further narrowed by second region 17a, so that high electric field can be prevented from being directly applied to base region 13.

Third Embodiment

A construction of a MOSFET as a silicon carbide semiconductor device according to a third embodiment of the present invention will now be described. The MOSFET according to the third embodiment is different from the MOSFET according to the first embodiment in that bottom portion B1 of trench T1 is in contact with first region 17c, and other features are substantially the same as those of the MOSFET according to the first embodiment. Therefore, the same or corresponding elements have the same reference characters allotted and description thereof will not be repeated.

Figure 17:
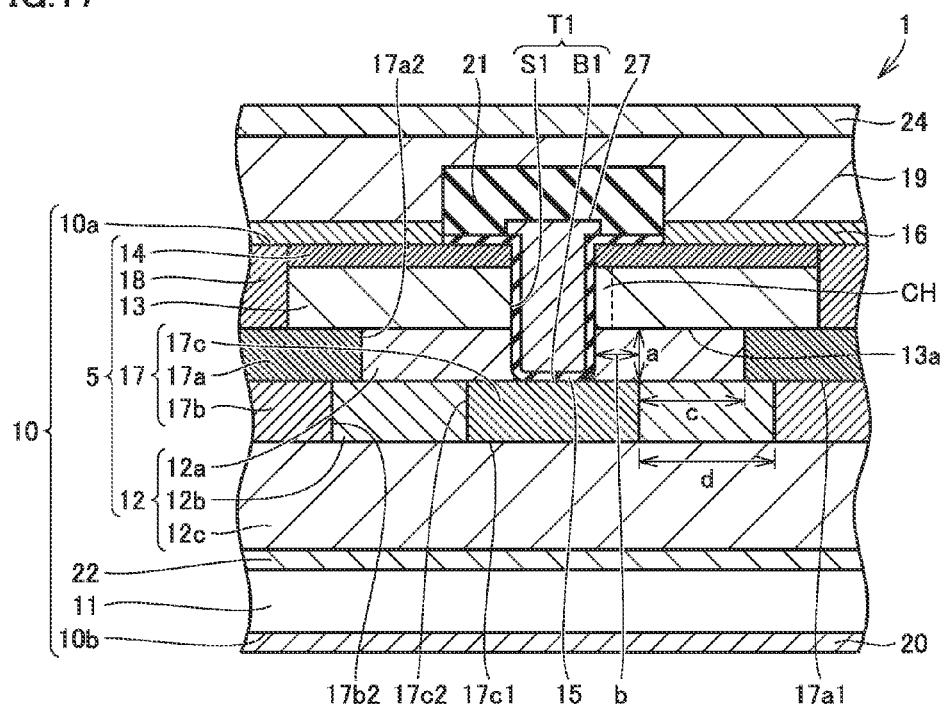
FIG. 17 is a schematic cross-sectional view for schematically illustrating a structure of a silicon carbide semiconductor device according to a third embodiment of the present invention.

Referring to FIG. 17, bottom portion B1 of trench T1 is in contact with first region 17c. Trench T1 may reach first region 17c, for example, through third region 12a. Third region 12a does not have to be provided between bottom portion B1 of trench T1 and first region 17c. Bottom portion B1 of trench T1 may be located flush with a boundary surface between second region 17a and fifth region 17b. As a result of contact of first region 17c with bottom portion B1 of trench T1, concentration of electric field at bottom portion B1 of trench T1 can effectively be relaxed.

Though the n-type is defined as the first conductivity type and the p-type is defined as the second conductivity type in each embodiment, the p-type may be defined as the first conductivity type and the n-type may be defined as the second conductivity type. Though description is given by way of example of a MOSFET as the silicon carbide semiconductor device, the silicon carbide semiconductor device may be an insulated gate bipolar transistor (IGBT). When the silicon carbide semiconductor device is an IGBT, first electrode 16 may be an emitter electrode and second electrode 20 may be a collector electrode. Though side surface S1 of trench T1 is substantially perpendicular to first main surface 10a of silicon carbide substrate 10, side surface S1 of trench T1 may be inclined with respect to first main surface 10a.

Example 1

A result of calculation by simulation of a characteristic on-resistance and a breakdown voltage of a MOSFET in an example in which distance a in the MOSFET (see FIG. 16) according to the second embodiment (a distance between base region 13 and first region 17c in the direction perpendicular to second main surface 10b) is varied will be described. A characteristic on-resistance and a breakdown voltage of the MOSFET were calculated with a value for distance a being varied from 0.3 μm to 2.5 μm. Distance b (a distance between the point of contact between side surface S1 and bottom portion B1 of trench T1 and side surface 17c2 of first region 17c in the direction in parallel to second main surface 10b) was set to 0.2 μm Distance c (a distance between side surface 17c2 of first region 17c and side surface 17a2 of second region 17a in the direction in parallel to second main surface 10b) was set to 0.7 μm. A concentration of an impurity in fourth region 12c was set to $8 \times 10^{15}$ cm$^{-3}$. A concentration of an impurity in sixth region 12b was set to $4.8 \times 10^{16}$ cm$^{-3}$. A concentration of an impurity in third region 12a was set to $4 \times 10^{16}$ cm$^{-3}$. A concentration of an impurity in each of first region 17c, second region 17a, and fifth region 17b was set to $2 \times 10^{18}$ cm$^{-3}$. A concentration of an impurity in base region 13 was set to $5 \times 10^{15}$ cm$^{-3}$.

Figure 18:
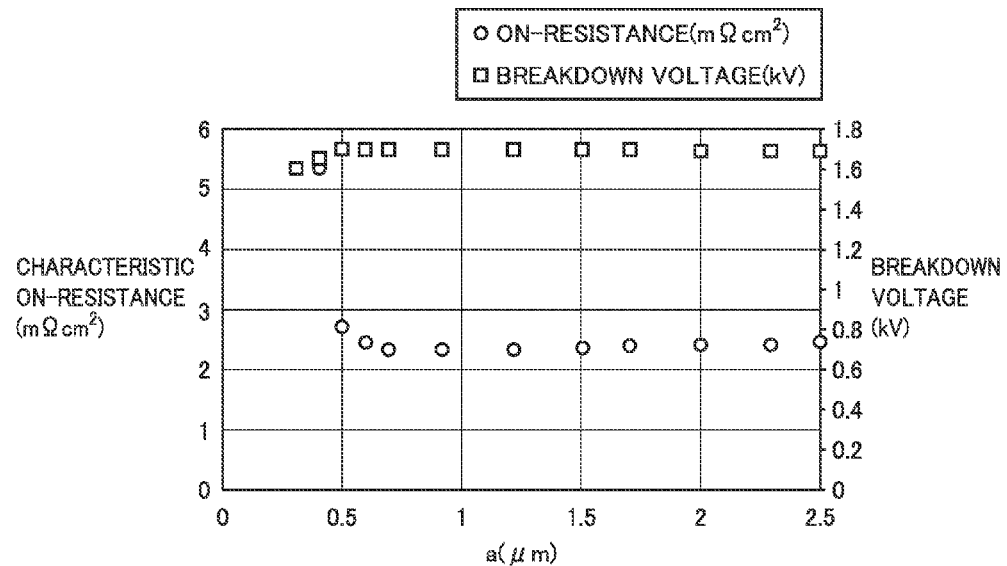
FIG. 18 shows simulation data showing relation between a distance a and a characteristic on-resistance and relation between distance a and a breakdown voltage.

Relation between distance a and a characteristic on-resistance and relation between distance a and a breakdown voltage will be described with reference to FIG. 18. In the figure, the abscissa represents distance a (μm), the left ordinate represents a characteristic on-resistance (mΩcm$^2$) of the MOSFET, and the right ordinate represents a breakdown voltage (kV) of the MOSFET. In the figure, a white circle represents a value for an on-resistance and a white square represents a value for a breakdown voltage.

Regarding the characteristic on-resistance, in a range in which distance a is not smaller than 0.7 μm and not greater than 2.5 μm, a characteristic on-resistance is substantially constant. When distance a is smaller than 0.7 however, a characteristic on-resistance gradually increases, and when distance a is smaller than 0.5 μm, a characteristic on-resistance abruptly increases. When distance a is 0.3 μm, a characteristic on-resistance exceeds 6 mΩcm$^2$ and is not shown in FIG. 18. Regarding the breakdown voltage, in a range in which distance a is not smaller than 0.5 μm and not greater than 2.5 μm, a breakdown voltage is substantially constant. When distance a is smaller than 0.5 μm, however, an on-resistance increases. When a concentration of an impurity in third region 12a and sixth region 12b is increased by one order from the condition in the plot in FIG. 18, the lower limit of distance a is approximately 0.2 μm. It was found from the results above that a range of distance a in which a high breakdown voltage and a low characteristic on-resistance can both be achieved is not smaller than 0.2 μm and not greater than 2 μm and preferably not smaller than 0.6 μm and not greater than 1.5 μm.

Example 2

A result of calculation by simulation of maximum electric field of a gate oxide film (gate insulating film 15) and a breakdown voltage of a MOSFET when distance b in the MOSFET (see FIG. 16) according to the second embodiment is varied will be described. Maximum electric field of the gate oxide film and a breakdown voltage of the MOSFET were calculated with a value for distance b being varied from −0.1 μm to 0.5 μm. A value for distance b being 0 means that side surface 17c2 of first region 17c and side surface S1 of trench T1 are located on the same line. A negative value for distance b means that side surface 17c2 of first region 17c retracts relative to side surface S1 of trench T1 with respect to fifth region 17b. A positive value for distance b means that side surface 17c2 of first region 17c protrudes toward fifth region 17b relative to side surface S1 of trench T1. Distance a was set to 0.6 μm Distance c was set to 0.7 μm A concentration of an impurity in fourth region 12c was set to $8 \times 10^{15}$ cm$^{-3}$. A concentration of an impurity in sixth region 12b was set to $4.8 \times 10^{16}$ cm$^{-3}$. A concentration of an impurity in third region 12a was set to $4 \times 10^{16}$ cm$^{-3}$. A concentration of an impurity in each of first region 17c, second region 17a, and fifth region 17b was set to $2 \times 10^{18}$ cm$^{-3}$. A concentration of an impurity in base region 13 was set to $5 \times 10^{15}$ cm$^{-3}$.

Figure 19:
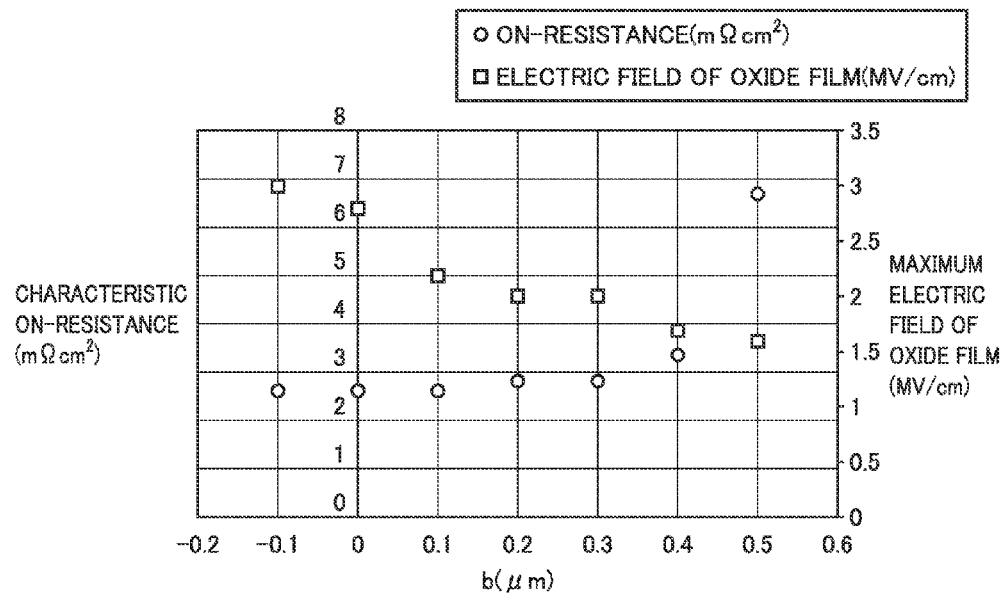
FIG. 19 shows simulation data showing relation between a distance b and a characteristic on-resistance and relation between distance a and a breakdown voltage.

Relation between distance b and maximum electric field of the gate oxide film and relation between distance b and a breakdown voltage will be described with reference to FIG. 19. In the figure, the abscissa represents distance b (μm), the left ordinate represents a characteristic on-resistance (mΩcm$^2$) of the MOSFET, and the right ordinate represents maximum electric field (MV/cm) of the gate oxide film. In the figure, a white circle represents a value for an on-resistance and a white square represents a value for maximum electric field of the gate oxide film.

Regarding the characteristic on-resistance, in a range in which distance b is not smaller than −0.1 μm and not greater than 0.4 μm, a characteristic on-resistance is substantially constant. When distance b is not smaller than 0.5 μm, a characteristic on-resistance gradually increases. Regarding maximum electric field of the gate oxide film, in a range in which distance b is not smaller than 0.1 μm and not greater than 0.5 μm, intensity of maximum electric field sufficiently lower than maximum electric field of 3 MV/cm at which reliability of the oxide film can be maintained can be maintained. When distance a is smaller than 0.1 μm, however, intensity of maximum electric field of the gate oxide film increases. It was found from the results above that a range of distance b in which a low characteristic on-resistance can be achieved while intensity of maximum electric field of the gate oxide film is maintained at most intensity of maximum electric field (3 MV/cm) at which reliability can be maintained was not smaller than 0.1 μm and not greater than 0.5 μm and preferably not smaller than 0.2 μm and not greater than 0.4 μm.

Example 3

A result of calculation by simulation of a characteristic on-resistance and a breakdown voltage of a MOSFET in an example in which distance c in the MOSFET (see FIG. 16) according to the second embodiment is varied will be described. A characteristic on-resistance and a breakdown voltage of the MOSFET were calculated with a value for distance c being varied from 0.1 μm to 1.9 μm. Distance a was set to 0.6 μm. Distance b was set to 0.2 μm. Distance d was set to 1.5 μm. A concentration of an impurity in fourth region 12c was set to $8 \times 10^{15}$ cm$^{-3}$. A concentration of an impurity in sixth region 12b was set to $4.8 \times 10^{16}$ cm$^{-3}$. A concentration of an impurity in third region 12a was set to $4 \times 10^{16}$ cm$^{-3}$. A concentration of an impurity in each of first region 17c, second region 17a, and fifth region 17b was set to $2 \times 10^{18}$ cm$^{-3}$. A concentration of an impurity in base region 13 was set to $5 \times 10^{15}$ cm$^{-3}$.

Figure 20:
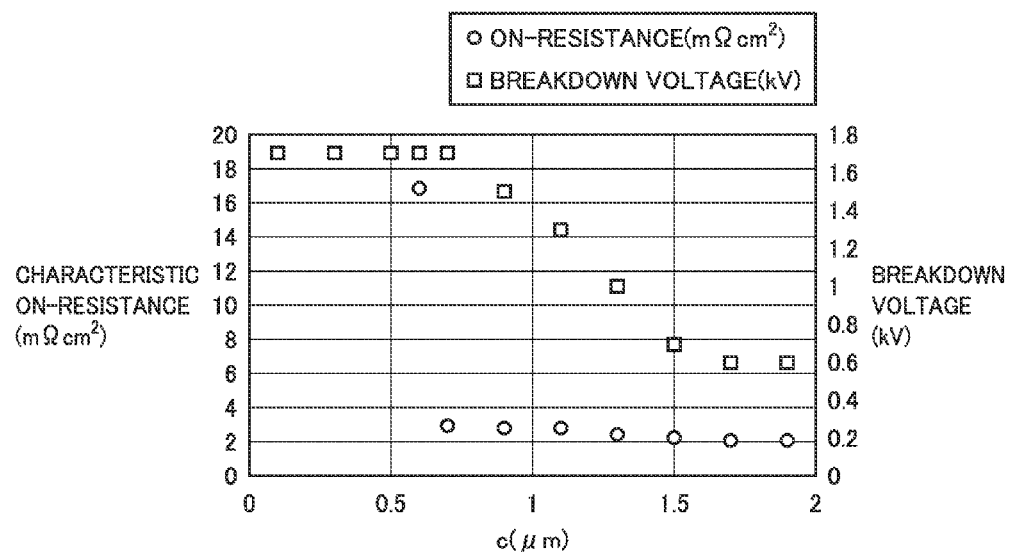
FIG. 20 shows simulation data showing relation between a distance c and a characteristic on-resistance and relation between distance a and a breakdown voltage.

Relation between distance c and a characteristic on-resistance and relation between distance c and a breakdown voltage will be described with reference to FIG. 20. In the figure, the abscissa represents distance c (μm), the left ordinate represents a characteristic on-resistance (mΩcm$^2$) of the MOSFET, and the right ordinate represents a breakdown voltage of the MOSFET. In the figure, a white circle represents a value for an on-resistance and a white square represents a value for a breakdown voltage.

Regarding the characteristic on-resistance, in a range in which distance c is not smaller than 0.7 μm and not greater than 1.9 μm, a characteristic on-resistance is substantially constant. When distance b is 0.6 μm, however, a characteristic on-resistance gradually increases, and when distance b is smaller than 0.6 μm, a value for a characteristic on-resistance abruptly increases to exceed 20 mΩcm$^2$. Regarding the breakdown voltage, in a range in which distance c is not smaller than 0.1 μm and not greater than 0.7 μm, a substantially constant high breakdown voltage can be maintained. When distance c exceeds 0.7 µm, a breakdown voltage removably lowers, and when distance c is in a range not smaller than 1.7 µm and not greater than 1.9 µm, the breakdown voltage maintains a substantially constant value. It was found from the results above that a range of distance c in which a high breakdown voltage and a low characteristic on-resistance can both be achieved is not smaller than 0.6 µm and not greater than 1.5 µm and preferably not smaller than 0.7 µm and not greater than 1.0 µm.

Example 4

A result of calculation by simulation of a characteristic on-resistance and a breakdown voltage of a MOSFET in an example in which distance d in the MOSFET (see FIG. 16) according to the second embodiment is varied will be described. In a first example (see FIG. 21), a characteristic on-resistance and a breakdown voltage of the MOSFET were calculated with distance c being set to 0.8 µm and a value for distance d being varied from 0.7 µm to 1.5 µm. In a second example (see FIG. 22), distance c was set to 0.9 µm and a value for distance d was varied from 0.9 µm to 1.5 µm. In both examples, distance a was set to 0.6 µm. Distance b was set to 0.2 µm. A concentration of an impurity in fourth region 12c was set to $8\times10^{15}$ cm$^{-3}$. A concentration of an impurity in sixth region 12b was set to $4.8\times10^{16}$ cm$^{-3}$. A concentration of an impurity in third region 12a was set to $4\times10^{16}$ cm$^{-3}$. A concentration of an impurity in each of first region 17c, second region 17a, and fifth region 17b was set to $2\times10^{18}$ cm$^{-3}$. A concentration of an impurity in base region 13 was set to $5\times10^{15}$ cm$^{-3}$.

Relation between distance d and a characteristic on-resistance and relation between distance d and a breakdown voltage will be described with reference to FIGS. 21 and 22. In the figures, the abscissa represents distance d (µm), the left ordinate represents a characteristic on-resistance (mΩcm$^2$) of the MOSFET, and the right ordinate represents a breakdown voltage of the MOSFET. In the figures, a white circle represents a value for an on-resistance and a white square represents a value for a breakdown voltage.

Figure 21:
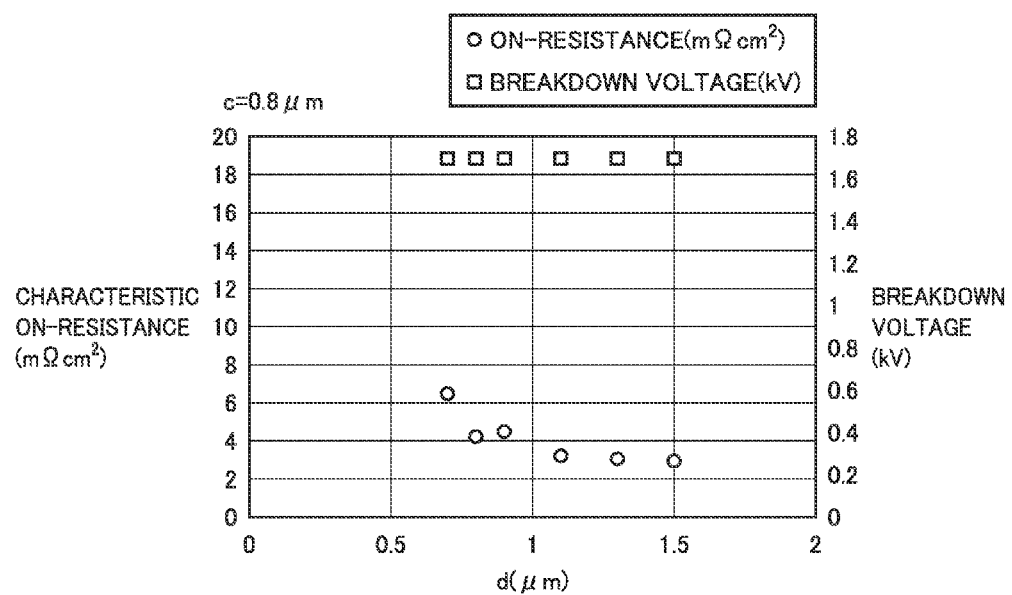
FIG. 21 shows simulation data showing relation between a distance d and a characteristic on-resistance and relation between distance a and a breakdown voltage when distance c is set to 0.8 μm.
Figure 22:
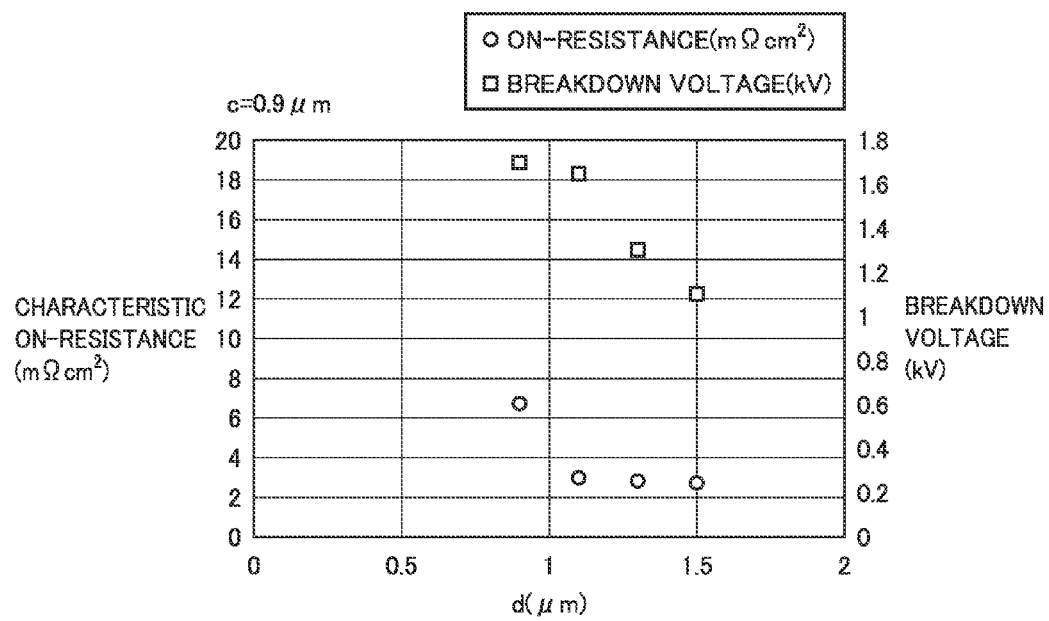
FIG. 22 shows simulation data showing relation between distance d and a characteristic on-resistance and relation between distance a and a breakdown voltage when distance c is set to 0.9 μm.

Referring to FIG. 21, in a range in which distance d is not smaller than 0.7 µm and not greater than 1.5 µm, a low characteristic on-resistance and a high breakdown voltage can be maintained. Referring to FIG. 22, in a range in which distance d is not greater than 1.1 µm, a high breakdown voltage can be maintained while a low characteristic on-resistance is maintained. It was found from the results above that a range of distance d in which a high breakdown voltage and a low characteristic on-resistance can both be achieved is not smaller than 0.5 µm and not greater than 1.5 µm, preferably not smaller than 0.7 µm and not greater than 1.5 µm, and further preferably not smaller than 0.7 µm and not greater than 1.0 µm.

Example 5

A result of calculation by simulation of a characteristic on-resistance of a MOSFET in an example in which a concentration of an impurity in second impurity region 13 in the MOSFET (see FIG. 16) according to the second embodiment is varied will be described. A characteristic on-resistance of the MOSFET was calculated with a value for a concentration of an impurity in second impurity region 13 being varied from $3\times10^{15}$ cm$^{-3}$ to $5\times10^{16}$ cm$^{-3}$. Distance c was set to 0.7 µm.

Figure 23:
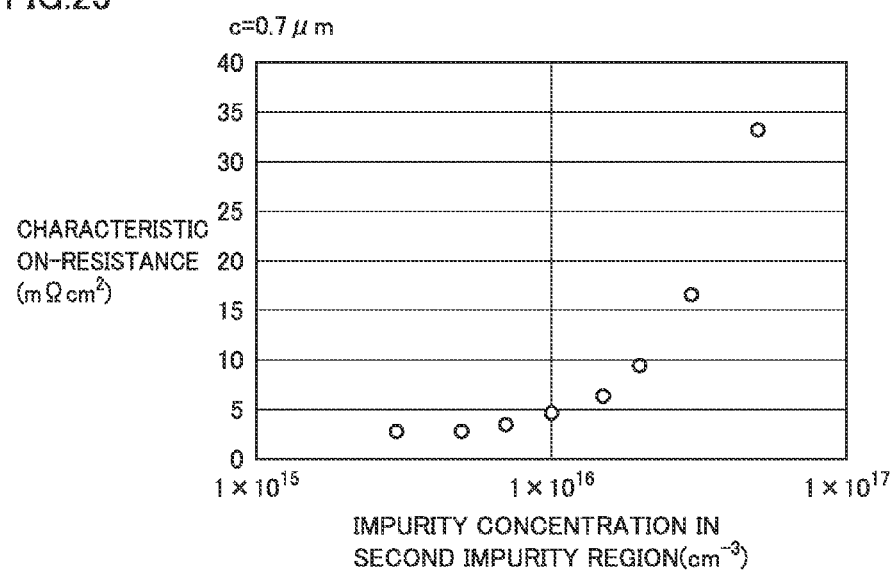
FIG. 23 shows simulation data showing relation between an impurity concentration in a second impurity region and a characteristic on-resistance when distance c is set to 0.7 μm.

Relation between a concentration of an impurity in the second impurity region and a characteristic on-resistance will be described with reference to FIG. 23. In the figure, the abscissa represents a concentration of an impurity in the second impurity region (cm$^{-3}$) and the left ordinate represents a characteristic on-resistance (mΩcm$^2$) of the MOSFET.

As a concentration of an impurity in second impurity region 13 forming the channel is lower, mobility is higher. According to the structure of the MOSFET shown in the second embodiment, even when a concentration of an impurity in the second impurity region is equal to or lower than $1\times10^{17}$ cm$^{-3}$, a high breakdown voltage can be maintained without occurrence of punch through in the second impurity region. Even when a concentration of an impurity in the second impurity region is lowered to $3\times10^{15}$ cm$^{-3}$, a breakdown voltage can be maintained. An effect of improvement in mobility, however, is not obtained even when a concentration of an impurity is lower than $3\times10^{15}$ cm$^{-3}$, whereas a short channel effect takes place. Therefore, a concentration of an impurity in second impurity region 13 is desirably not lower than $3\times10^{15}$ cm$^{-3}$ and not higher than $3\times10^{16}$ cm$^{-3}$. A concentration of an impurity in each of first region 17c, second region 17a, and fifth region 17b is preferably not lower than $1\times10^{18}$ cm$^{-3}$ from a point of view of maintaining a high breakdown voltage and preferably not higher than $2\times10^{19}$ cm$^{-3}$ from a point of view of suppression of a leakage current due to a defect.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 silicon carbide semiconductor device (MOSFET); 5 silicon carbide epitaxial layer; 10 silicon carbide substrate; 10a first main surface; 10b second main surface; 11 silicon carbide single-crystal substrate; 12 drift region (first impurity region); 12a third region; 12b sixth region; 12c fourth region; 13 base region (second impurity region); 14 source region (third impurity region); 15 gate insulating film; 16 first electrode (source electrode); 17 fourth impurity region (embedded region); 17a2, 17b2, 17c2, S1 side surface; 17a1, 17c1 surface; 17a second region; 17b fifth region; 17c first region; 17d connection portion; 18 contact region; 19 source interconnection; 20 second electrode (drain electrode); 21 interlayer insulating film; 22 buffer layer; 24, 43 protecting film; 27 gate electrode; 41 ion implantation mask; 42 through film; 44 etching mask; B1 bottom portion; CH channel region; T1 trench; and a, b, c, d distance.

The invention claimed is:
1. A silicon carbide semiconductor device comprising:
a silicon carbide substrate having a first main surface and a second main surface opposite to the first main surface, the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region, the first main surface of the silicon carbide substrate having a trench provided, the trench having a side surface continuous to the first main surface and a bottom portion continuous to the side surface, the fourth impurity region including a first region facing the bottom portion of the trench and a part of the second impurity region and a second region facing the second impurity region, the first impurity region including a third region in contact with the side surface of the trench, the second impurity region, the first region, and the second region and a fourth region which is located on a side of the second main surface relative to the third region, electrically connected to the third region, and lower in impurity concentration than the third region, a surface of the first region facing the second main surface being located on the side of the second main surface in a direction perpendicular to the second main surface relative to a surface of the second region facing the second main surface;

a gate insulating film in contact with the third region, the second impurity region, and the third impurity region at the side surface of the trench;

a gate electrode provided on the gate insulating film;

a first electrode electrically connected to the third impurity region on a side of the first main surface; and a second electrode electrically connected to the fourth region on the side of the second main surface, the fourth impurity region being electrically connected to the first electrode, wherein the fourth impurity region further includes a fifth region which is located opposite to the second impurity region when viewed from the second region and is in contact with the second region.

2. The silicon carbide semiconductor device according to claim 1, wherein
a side surface of the second region is provided to protrude toward the side surface of the trench relative to a side surface of the fifth region.

3. The silicon carbide semiconductor device according to claim 1, wherein
a side surface of the second region is provided to retract toward a side opposite to the side surface of the trench relative to a side surface of the fifth region.

4. The silicon carbide semiconductor device according to claim 1, wherein
a distance between the second impurity region and the first region in a direction perpendicular to the second main surface is not smaller than 0.2 um and not greater than 2 μm.

5. The silicon carbide semiconductor device according to claim 1, wherein
a distance between a point of contact between the side surface and the bottom portion of the trench and a side surface of the first region in a direction in parallel to the second main surface is not smaller than 0.1 μm and not greater than 0.5 μm.

6. The silicon carbide semiconductor device according to claim 1, wherein
a distance between a side surface of the first region and a side surface of the second region in a direction in parallel to the second main surface is not smaller than 0.6 μm and not greater than 1.5 μm.

7. The silicon carbide semiconductor device according to claim 1, wherein
a concentration of an impurity in the third region is not lower than $1 \times 10^{16}$ cm$^{-3}$ and not higher than $4 \times 10^{17}$ cm$^{-3}$.

8. The silicon carbide semiconductor device according to claim 1, wherein
a concentration of an impurity in the second impurity region is not lower than $1 \times 10^{15}$ cm$^{-3}$ and not higher than $4 \times 10^{17}$ cm$^{-3}$.

9. A method for manufacturing a silicon carbide semiconductor device comprising:

preparing a silicon carbide substrate having a first main surface and a second main surface opposite to the first main surface, the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region, the first main surface of the silicon carbide substrate having a trench provided, the trench having a side surface continuous to the first main surface and a bottom portion continuous to the side surface, the fourth impurity region including a first region facing the bottom portion of the trench and a part of the second impurity region and a second region facing the second impurity region, the first impurity region including a third region in contact with the side surface of the trench, the second impurity region, the first region, and the second region and a fourth region which is located on a side of the second main surface relative to the third region, electrically connected to the third region, and lower in impurity concentration than the third region, a surface of the first region facing the second main surface being located on the side of the second main surface in a direction perpendicular to the second main surface relative to a surface of the second region facing the second main surface;

forming a gate insulating film in contact with the third region, the second impurity region, and the third impurity region at the side surface of the trench;

forming a gate electrode on the gate insulating film;

forming a first electrode electrically connected to the third impurity region on a side of the first main surface; and forming a second electrode electrically connected to the fourth region on the side of the second main surface, the fourth impurity region being electrically connected to the first electrode, wherein forming the silicon carbide substrate includes
forming the fourth region through epitaxial growth,
forming the first region by implanting ions into the fourth region,
forming the third region on the first region through epitaxial growth, and
forming the second region by implanting ions into the third region.

10. The method for manufacturing a silicon carbide semiconductor device according to claim 9, wherein
forming the silicon carbide substrate further includes
forming a sixth region which has the first conductivity type and is higher in impurity concentration than the fourth region by implanting ions into the fourth region, and in forming the third region, the third region is formed on each of the first region and the sixth region.

11. The method for manufacturing a silicon carbide semiconductor device according to claim 9, wherein forming the silicon carbide substrate further includes forming the second impurity region in contact with both of the second region and the third region through epitaxial growth.

12. The method for manufacturing a silicon carbide semiconductor device according to claim 9, wherein the fourth impurity region further includes a fifth region which is located opposite to the second impurity region when viewed from the second region and is in contact with the second region.

13. The method for manufacturing a silicon carbide semiconductor device according to claim 12, wherein a side surface of the second region is provided to protrude toward the side surface of the trench relative to a side surface of the fifth region.

14. The method for manufacturing a silicon carbide semiconductor device according to claim 12, wherein a side surface of the second region is provided to retract toward a side opposite to the side surface of the trench relative to a side surface of the fifth region.

15. The method for manufacturing a silicon carbide semiconductor device according to claim 9, wherein a distance between the second impurity region and the first region in a direction perpendicular to the second main surface is not smaller than 0.2 µm and not greater than 2 µm.

16. The method for manufacturing a silicon carbide semiconductor device according to claim 9, wherein a distance between a point of contact between the side surface and the bottom portion of the trench and a side surface of the first region in a direction in parallel to the second main surface is not smaller than 0.1 µm and not greater than 0.5 µm.

17. The method for manufacturing a silicon carbide semiconductor device according to claim 9, wherein a distance between a side surface of the first region and a side surface of the second region in a direction in parallel to the second main surface is not smaller than 0.6 µm and not greater than 1.5 µm.

18. A method for manufacturing a silicon carbide semiconductor device comprising:

preparing a silicon carbide substrate having a first main surface and a second main surface opposite to the first main surface, the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region, the first main surface of the silicon carbide substrate having a trench provided, the trench having a side surface continuous to the first main surface and a bottom portion continuous to the side surface, the fourth impurity region including a first region facing the bottom portion of the trench and a part of the second impurity region and a second region facing the second impurity region, the first impurity region including a third region in contact with the side surface of the trench, the second impurity region, the first region, and the second region and a fourth region which is located on a side of the second main surface relative to the third region, electrically connected to the third region, and lower in impurity concentration than the third region, a surface of the first region facing the second main surface being located on the side of the second main surface in a direction perpendicular to the second main surface relative to a surface of the second region facing the second main surface;

forming a gate insulating film in contact with the third region, the second impurity region, and the third impurity region at the side surface of the trench;

forming a gate electrode on the gate insulating film;

forming a first electrode electrically connected to the third impurity region on a side of the first main surface; and forming a second electrode electrically connected to the fourth region on the side of the second main surface, the fourth impurity region being electrically connected to the first electrode, wherein forming the silicon carbide substrate includes
forming the fourth region through epitaxial growth,
forming the third region on the fourth region through epitaxial growth,
forming the first region in contact with the fourth region by implanting ions into the fourth region with first implantation energy, and
forming the second region in contact with the third region by implanting ions into the third region with second implantation energy lower than the first implantation energy.

19. The method for manufacturing a silicon carbide semiconductor device according to claim 18, wherein forming the silicon carbide substrate further includes forming the second impurity region in contact with both of the second region and the third region through epitaxial growth.

20. The method for manufacturing a silicon carbide semiconductor device according to claim 18, wherein the fourth impurity region further includes a fifth region which is located opposite to the second impurity region when viewed from the second region and is in contact with the second region.

21. The method for manufacturing a silicon carbide semiconductor device according to claim 20, wherein a side surface of the second region is provided to protrude toward the side surface of the trench relative to a side surface of the fifth region.

22. The method for manufacturing a silicon carbide semiconductor device according to claim 20, wherein a side surface of the second region is provided to retract toward a side opposite to the side surface of the trench relative to a side surface of the fifth region.

23. The method for manufacturing a silicon carbide semiconductor device according to claim 18, wherein a distance between the second impurity region and the first region in a direction perpendicular to the second main surface is not smaller than 0.2 µm and not greater than 2 µm.

24. The method for manufacturing a silicon carbide semiconductor device according to claim 18, wherein a distance between a point of contact between the side surface and the bottom portion of the trench and a side surface of the first region in a direction in parallel to the second main surface is not smaller than 0.1 μm and not greater than 0.5 μm.

25. The method for manufacturing a silicon carbide semiconductor device according to claim 18, wherein
a distance between a side surface of the first region and a side surface of the second region in a direction in parallel to the second main surface is not smaller than 0.6 μm and not greater than 1.5 μm.

* * * * *